United States Patent
Hori et al.

(10) Patent No.: US 9,713,241 B2
(45) Date of Patent: Jul. 18, 2017

(54) REACTIVE-SPECIES SUPPLY DEVICE AND SURFACE TREATMENT APPARATUS

(75) Inventors: Masaru Hori, Nagoya (JP); Hiroyuki Kano, Miyoshi (JP); Tetsunori Kawasumi, Nagoya (JP); Naofumi Yoshida, Obu (JP); Akihiro Kawajiri, Chiryu (JP); Toshimitsu Watanabe, Chiryu (JP); Joji Isozumi, Nagakute (JP)

(73) Assignees: FUJI MACHINE MFG. CO., LTD., Chiryu-shi (JP); NATIONAL UNIVERSITY CORPORATION NAGOYA UNIVERSITY, Nagoya (JP)

( * ) Notice: Subject to any disclaimer, the term of this patent is extended or adjusted under 35 U.S.C. 154(b) by 1091 days.

(21) Appl. No.: 13/807,249

(22) PCT Filed: Jun. 30, 2011

(86) PCT No.: PCT/JP2011/065007
§ 371 (c)(1),
(2), (4) Date: Mar. 14, 2013

(87) PCT Pub. No.: WO2012/002478
PCT Pub. Date: Jan. 5, 2012

(65) Prior Publication Data
US 2013/0174984 A1 Jul. 11, 2013

(30) Foreign Application Priority Data
Jun. 30, 2010 (JP) .................................. 2010-149524

(51) Int. Cl.
H05H 1/00 (2006.01)
H01J 37/00 (2006.01)
(Continued)

(52) U.S. Cl.
CPC .......... *H05H 1/24* (2013.01); *H01J 37/32559* (2013.01); *H05H 1/48* (2013.01);
(Continued)

(58) Field of Classification Search
CPC ...... H05H 2001/488; H05H 1/24; H05H 1/48; H01J 37/32568; H01J 37/32558; B23K 9/1675
(Continued)

(56) References Cited

U.S. PATENT DOCUMENTS 3,803,808 A * 4/1974 Shibuya .................... B03C 3/12
96/54
4,090,976 A * 5/1978 DeHollander ......... C01G 43/01
252/636
(Continued)

FOREIGN PATENT DOCUMENTS

| CN | 1823554 A | 8/2006 |
|---|---|---|
| CN | 101360846 A | 2/2009 |

(Continued)

OTHER PUBLICATIONS

Office Action issued in Japanese Application No. 2010-149524 mailed May 20, 2014 (with translation).
(Continued)

*Primary Examiner* — Gordon R Baldwin
*Assistant Examiner* — Charlee Bennett
(74) *Attorney, Agent, or Firm* — Oliff PLC

(57) ABSTRACT

A reactive-species supply device is configured to supply a treatment gas to an electric discharge space, for thereby supplying at least a reactive species formed in a plasma, to an object. The reactive-species supply device includes (a) at least one pair of electrodes configured to form the electric discharge space and (b) an electrode protection device configured to protect the electrodes from the treatment gas.
(Continued)

Also disclosed is a surface treatment apparatus that includes the reactive-species supply device.

10 Claims, 13 Drawing Sheets

(51) Int. Cl.
*H05H 1/24* (2006.01)
*H01J 37/32* (2006.01)
*H05H 1/48* (2006.01)

(52) U.S. Cl.
CPC .. *H01J 37/32733* (2013.01); *H05H 2001/485* (2013.01); *H05H 2001/488* (2013.01); *H05H 2245/123* (2013.01)

(58) Field of Classification Search
USPC .......................................................... 118/719
See application file for complete search history.

(56) References Cited

U.S. PATENT DOCUMENTS

| | | | | |
|---|---|---|---|---|
| 4,341,944 | A * | 7/1982 | Breen | B23K 9/1675 219/123 |
| 5,278,388 | A * | 1/1994 | Huang | B23K 10/00 219/121.45 |
| 7,453,191 | B1 * | 11/2008 | Song | H01J 37/32357 313/231.31 |
| 2004/0020598 | A1 * | 2/2004 | Itatani | B01D 53/323 156/345.29 |
| 2007/0002515 | A1 | 1/2007 | Hino et al. | |
| 2009/0200948 | A1 * | 8/2009 | Selwyn | H01J 37/32082 315/111.21 |
| 2009/0288602 | A1 * | 11/2009 | Satake | C23C 16/4412 118/723 E |
| 2010/0055347 | A1 * | 3/2010 | Kato | C23C 16/452 427/569 |
| 2010/0130009 | A1 | 5/2010 | Ishimaru | |
| 2011/0278178 | A1 * | 11/2011 | Pierce | B22F 9/20 205/571 |
| 2013/0168361 | A1 * | 7/2013 | Hori | H05H 1/48 219/69.11 |

FOREIGN PATENT DOCUMENTS

| | | |
|---|---|---|
| JP | A-11-168094 | 6/1999 |
| JP | A-2004-134465 | 4/2004 |
| JP | A-2006-128281 | 5/2006 |
| JP | A-2006-302653 | 11/2006 |
| JP | A-2008-243481 | 10/2008 |
| JP | A-2010-129666 | 6/2010 |
| WO | WO 2009/069204 A1 | 6/2009 |

OTHER PUBLICATIONS

Sep. 20, 2011 International Search Report issued in International Application No. PCT/JP2011/065007 (with translation).
Feb. 12, 2013 International Preliminary Report on Patentability issued in International Application No. PCT/JP2011/065007 (with translation).
Dec. 23, 2014 Office Action issued in Chinese Patent Application No. 201180031925.7.

* cited by examiner

REACTIVE-SPECIES SUPPLY DEVICE AND SURFACE TREATMENT APPARATUS

TECHNICAL FIELD

The present invention relates to a reactive-species supply device configured to supply at least reactive species such as a radical, and a surface treatment apparatus having the reactive-species supply device and configured to perform a treatment on a surface or the like of an object.

BACKGROUND ART

Patent Document 1 discloses a reactive-species supply device and also a surface treatment apparatus having the reactive-species supply device. The disclosed reactive-species supply device is configured to supply a treatment gas to an electric discharge space, for thereby supplying a reactive species or the like formed in a plasma, to an object.

PRIOR ART DOCUMENT

Patent Document

[Patent Document 1] JP-2006-302653A

DISCLOSURE OF THE INVENTION

Object to be Achieved by the Invention

In a reactive-species supply device, a plasma is generated in an electric discharge space by an electric discharge caused between at least one pair of electrodes, and a treatment gas is supplied to the electric discharge space, whereby a reactive species such as a radical formed in the plasma is supplied to an object. Where the treatment gas supplied to the electric discharge space contains oxygen and the electric discharge is carried out with the electrodes being in contact with the treatment gas containing the oxygen, there would be a problem that reduces the service life of the electrodes, for example, due to oxidization and wear of the electrodes. Since a high electric voltage is applied between the electrodes, the electrodes are heated to a high temperature so as to be oxidized.

It is therefore an object of the present invention is to improve a reactive-species supply device and a surface treatment apparatus including the reactive-species supply device. Specifically, the object of the invention is to solve the above-described problem.

Measures for Achieving the Object and Effect

A reactive-species supply device according to the present invention includes an electrode protection device that is configured to protect electrodes from a treatment gas. Owing to provision of the electrode protection device in the reactive-species supply device, the electrodes are protected from the treatment gas, so that it is possible to restrain oxidation of the electrodes and accordingly to increase a service life of the electrodes.

CLAIMABLE INVENTION

There will be described, by way of examples, some modes of the invention deemed to contain claimable features for which protection is sought.

(1) A reactive-species supply device configured to supply a treatment gas to an electric discharge space, for thereby supplying at least a reactive species formed in a plasma, to an object.

The reactive species is interpreted to mean a substance formed in the plasma, and corresponds to, for example, an excited atom, an excited molecule or other substance excited in the plasma and having a high energy. Further, the reactive species may be considered as being an electrically neutral substance.

The reactive species is interpreted to mean, for example, a substance having a function of modifying a surface or the like of an object or removing (i.e., cleaning) a substance (e.g., organic substance) adhering onto the surface of the object, by reacting with the object as such or with the substance adhering onto the surface of the object.

In the reactive-species supply device, it is possible to cause (a) a reactive species and (b) a substance not having a high energy, to be supplied to the object. The substance not having a high energy is interpreted to mean a substance that does not react even when being brought into contact with an object surface, and corresponds to a substance other than the reactive species. The substance other than the reactive species may be, for example, a non-excited substance or a non-activated substance, and corresponds to, for example, a carrier gas or the like.

Further, in the reactive-species supply device, it is also possible to cause a substance containing (a) an electrically-neutral reactive species (i.e., neutral particle) and (b) an aggregate, to be to be supplied to the object, wherein the aggregate contains a charged particle such as positive and negative ions and is electrically neutral as a whole. Where the aggregate irradiated onto the object is electrically neutral, the object is not charged so that an influence affecting the object is small.

It is noted that the object may be made of any material such as metal, ceramics and organic materials.

(2) The above-described reactive-species supply device includes at least one pair of electrodes configured to form the electric discharge space.

The reactive-species supply device may include a single pair of electrodes or two or more pairs of electrodes. That is, the reactive-species supply device may have an electric discharge space or two or more electric discharge spaces. The electric discharge space is a space provided between the pair of electrodes, and is a space for an electric discharge caused between the pair of electrodes. Where a plurality pairs of electrodes are provided, a plurality of electric discharge spaces are provided. In this case, the plurality of electric discharge spaces may be independent from each other or may be held in communication with each other (i.e., have a space common to the plurality of electric discharge spaces). Further, where three electrodes are arranged, it can be considered that the three arranged electrodes constitute two pairs of electrodes and that two electric discharge spaces are formed. In this case, it can be considered that one of the three arranged electrodes, which is located in a position intermediate between the other two electrodes, serves as a common electrode that is common to the two pairs of electrodes.

(3) In the above-described reactive-species supply device, the above-described plurality of electrodes are arranged at a given spacing in a direction perpendicular to a direction in which the above-described treatment gas is to be supplied to the electric discharge space.

There is a case where the electrode is interpreted to mean an element that is likely to cause an electric discharge when an electric voltage is applied thereto. Also there is a case where the electrode is interpreted to mean an element that actually causes an electric discharge when an electric voltage is applied thereto.

There is a case where the element that is likely to cause or actually causes the electric discharge is constituted by an entirety of the electrode. Also there is a case where the element that is likely to cause or actually causes the electric discharge is constituted by a part of the electrode.

For example, there is a case where a part of the electrode, in which the electric discharge is likely to be caused or actually caused, is determined depending on a shape of the entirety of the electrode, a shape of a cover covering the electrode and/or a construction of a main body of the reactive-species supply device holding the electrode. In this case, this part of the electrode serves as an electric-discharge electrode portion. Further, in a case where the electric discharge is caused in the entirety of the electrode, the electrode serves as an electric-discharge electrode.

On the other hand, the electric discharge is caused, in principle, between the pair of electrodes, wherein one of the electrodes serves as the electric-discharge electrode while the other of the electrodes serves as an opposite electrode. There is a case where the electric-discharge electrode and the opposite electrode are determined depending on, for example, a manner of controlling a power supply unit configured to apply an electric voltage and a manner of controlling a voltage adjustor device. Each one of the electrodes alternately serves as the electric-discharge electrode and the opposite electrode, for example, in a case where an alternating voltage is applied. In the description of the present invention, there is little necessity of distinguishing the electric-discharge electrode and the opposite electrode from each other, so that, in the present description, there is a case where each electrode is referred to as the electric-discharge electrode or electric-discharge electrode portion without distinction of the electric-discharge electrode and the opposite electrode from each other.

Further, the entirety of the electrode may generally have a bar-like shape or a plate-like shape.

Moreover, the plurality of electrodes may be arranged either in a single straight line or in a plurality of straight lines.

It is noted that the electric discharge is interpreted to mean an electric discharge caused between a pair of electrodes.

(4) In the above-described reactive-species supply device, each of the above-described electrodes has such a shape that causes a non-uniform electric field.

For example, where the entirety of the electrode includes (a) a main body having a generally cylindrical shape and (b) a protrusion portion provided in a part of the main body and protruding in a radial direction of the main body, a non-uniform electric field is easily formed in the protrusion portion so that an electric discharge is easily caused in the protrusion portion. In this case, the protrusion portion corresponds to the electric-discharge electrode portion.

Further, where the entirety of the electrode includes (c) a main body having a generally plate-like shape and (b) a pawl portion provided in the main body, the pawl portion corresponds to the electric-discharge electrode portion.

(5) In the above-described reactive-species supply device, each of the above-described electrodes has a width that is smaller than a distance between each adjacent two of the electrodes.

For example, where the plurality of electrodes are arranged at a given spacing in a single direction, a length D width) of the electric-discharge electrode portion, as measured in the single direction, is smaller than the spacing L (D<L). The width D of the electric-discharge electrode portion may be not larger than ½, ⅓, ¼ or ⅕ of the spacing L.

(6) The above-described reactive-species supply device includes at least three electrodes as the above-described plurality of electrodes.

The reactive-species supply device may include four electrodes or five or more electrodes.

Further, the at least three electrodes may be arranged either in a single row or in a plurality of rows. Where the at least three electrodes are arranged in a plurality of rows, the number of the electrodes arranged in at least one of the plurality of rows may be two or three or more.

(7) The above-described reactive-species supply device may be provided with an electrode protection device that is configured to protect the above-described electrodes from the above-described treatment gas.

(8) The above-described reactive-species supply device may be provided with an electrode protection device that is configured to protect the above-described electrodes from an oxygen.

(9) The above-described electrode protection device may include electrode covers that cover the above-described electrodes.

It is preferable that the electrode covers are adapted to cover the respective electrodes, independently of each other. The electrode covers, which cover the electrodes, may be provided with a connector or connectors connecting the electrode covers.

Each of the electrode covers is provided to cover at least a part of a corresponding one of the electrodes. Each electrode cover may be adapted to cover either an entirety or a part of the corresponding electrode.

Each electrode cover may be provided either with or without a clearance defined between the electrode cover and the corresponding electrode.

(10) Each adjacent two of the above-described electrode covers have respective electric-discharge openings provided in respective portions thereof which are opposed to each other.

Where the electrode refers to an element that is likely to cause an electric discharge and the electrode cover covers the entirety of the electrode with a clearance between the electrode cover and the electrode, it is preferable that the electric-discharge opening is provided in the electrode cover. In this case, a portion of the electrode, in which the electric-discharge opening is provided, serves as the electric-discharge electrode portion.

(11) Each of the above-described electrode covers may be provided with a clearance defined between each of the electrode covers and at least a part of a corresponding one of the above-described electrodes.

The clearance defined between each electrode cover and at least a part of the corresponding electrode serves a space to which a protective gas is to be supplied. Where this space has a small volume, an amount of the supplied protective gas is small. Where this space has a large volume, an amount of the supplied protective gas is large.

(12) The above-described electrode protection device may include a protective-gas supplying portion configured to supply a protective gas to at least a part of each of the above-described electrodes.

It is preferable that the protective-gas supplying portion is configured to supply the protective gas to a protection portion (i.e., surface) of each of the electrodes, which is to be protected from a treatment gas.

Where the electrode refers to an element that is likely to cause an electric discharge, the protective-gas supplying portion may be configured to supply the protective gas either to an entirety or a part of the electrode. Where the protective gas is supplied to a part of the electrode, it is preferable that the protective gas is supplied to a part including the electric-discharge electrode portion.

Where the electrode refers to the electric-discharge electrode, it is preferable that the protective gas is supplied to the entirety of the electrode.

It is noted that the provision of the electrode cover is not essential where the protective gas is supplied to the electrode. Even without the electrode cover, the protective gas can be supplied to a surface of the electrode whereby an atmosphere surrounding the electrode can be separated from the treatment gas.

Further, the protective-gas supplying portion may include a common supplying portion configured to commonly supply the protective gas to insides of the electrode covers or electrode-cover-directed individual supplying portions (i.e., electrode-directed individual supplying portions) configured to individually supply the protective gas to insides of the respective electrode covers.

It is noted that the protective-gas supplying portion is a portion that is other than a treatment-gas supplying portion, as described later.

(13) The above-described protective-gas supplying portion may include an electric-discharge-stage supplying portion configured to supply the above-described protective gas at least during an electric discharge.

The protective-gas supplying portion may be adapted to start supply of the protective gas when preparation of the electric discharge is started. Specifically, the protective-gas supplying portion may be adapted to start supply of the protective gas when application of an electric voltage to the electrodes is started.

(14) The above-described electrode protection device may include (i) electrode covers that cover the above-described respective electrodes and (ii) a protective-gas supplying portion configured to supply a protective gas to insides of the respective electrode covers.

(15) The above-described protective-gas supplying portion may include individual supplying portions configured to individually supply a protective gas to insides of respective electrode covers, wherein each of the individual supplying portions may include (i) a main passage connected to a protective-gas supply port that is provided in a main body of the above-described reactive-species supply device, (ii) a protective-gas inlet port provided in a corresponding one of the above-described electrode covers and (iii) an individual passage that individually connects the above-described main passage to the above-described protective-gas inlet port.

It is possible to consider that the main passage and the individual passage cooperate to constitute a protective-gas supply passage. Further, the individual supplying portion may be referred also to as an electrode-directed individual supplying portion, and the individual passage may be referred also to as an electrode-directed individual passage or electrode-cover-directed individual passage.

(16) The above-described protective-gas supplying portion may include a common supplying portion configured to commonly supply a protective gas to insides of the above-described respective electrode covers, wherein the common supplying portion may include (i) a communicating portion that communicates between clearances each of which is defined between a corresponding one of the above-described plurality of electrode covers and a corresponding one of the above-described plurality of electrodes and (ii) a protective-gas inlet port that is provided in one of the above-described plurality of electrode covers.

It is possible to consider that the communicating portion is constituted by a part of the electrode covers.

(17) The above-described protective-gas supplying portion includes protective-gas inlet ports provided in the above-described respective electrode covers, and electric-discharge openings are provided in mutually opposed portions of mutually adjacent ones of the electrode covers, the mutually opposed portions being opposed to each other and located on a downstream side of the above-described protective-gas supply port.

In each of the electrode covers, the protective-gas inlet port and the electric-discharge openings may be provided such that each of the electric-discharge openings is spaced apart from the protective-gas inlet port in an axial direction and/or a circumferential direction.

The protective-gas inlet port may be provided by a connection portion of each of the electrode covers at which the electrode cover is connected to the commutating portion.

(18) The above-described protective-gas supplying portion may include a protective-gas inlet port provided in each of the above-described respective electrode covers and a protective-gas outlet port provided on a downstream side of the protective-gas inlet port.

The protective-gas outlet port may either have or not have an opening that is opposed to the electric discharge space. That is, the protective gas supplied to inside of the electrode cover may be caused to outflow to the electric discharge space or may be caused to be exhausted to an exterior of the reactive-species supply device or collected. For example, the protective-gas outlet port may be connected to a protective-gas exhaust passage communicating with the exterior of the reactive-species supply device or to a protective-gas collection passage communicating with a protective-gas collection device. Where the protective-gas supplying portion has an opening that is opposed to the electric discharge space, the opening can be adapted to serve as the protective-gas outlet port.

(19) The above-described reactive-species supply device may be provided with a treatment-gas contact prevention device that is configured to prevent contact of the above-described treatment gas with the above-described electrodes.

(20) The above-described reactive-species supply device may be provided with a treatment-gas isolation device that is configured to isolate is the above-described electrodes from the above-described treatment gas.

(21) The above-described reactive-species supply device may be provided with an electrode-periphery-gas/treatment-gas separation device that is configured to separate the above-described treatment gas and a gas staying in a space surrounding each of the above-described electrodes, from each other.

The technical features described in any one of the above-described modes (7)-(18) can be employed in the treatment-gas contact prevention device, treatment-gas isolation device and electrode-periphery-gas/treatment-gas separation device.

(22) The above-described reactive-species supply device may be provided with an oxygen-gas contact prevention device that is configured to prevent contact of an oxygen gas with the above-described electrodes.

(23) The above-described reactive-species supply device may be provided with a treatment-gas isolation device that is configured to isolate the above-described electrodes from an oxygen gas.

(24) The above-described reactive-species supply device may be provided with an electrode-periphery-gas/oxygen-gas separation device that is configured to separate an oxygen gas and a gas staying in a space surrounding each of the above-described electrodes, from each other.

The technical features described in any one of the above-described modes (7)-(18) can be employed in the oxygen-gas contact prevention device, oxygen-gas isolation device and electrode-periphery-gas/oxygen-gas separation device.

(25) The above-described reactive-species supply device may be provided with an oxidation restraint device that is configured to restrain oxidation of the above-described electrodes.

The technical features described in any one of the above-described modes (7)-(18) can be employed in the oxidation restraint device.

(26) The above-described reactive-species supply device may be provided with a protective-gas handling portion that is configured to handle a protective gas supplied to the above-described electrodes.

There are a case where the protective gas is supplied to insides of the electrode covers and a case where the protective gas is supplied directly to the electrodes without provision of the electrode covers. In either case, the protective gas supplied to each electrode is handled, for example, by being exhausted to an exterior of the reactive-species supply device, or by being collected, or by being caused to flow together with the treatment gas, after flowing along a surface of the electrode.

(27) The above-described protective-gas handling portion may include a reactive-species-separation-type protective-gas handling portion that is configured to cause a protective gas, which has been supplied to the above-described electrodes and emitted to the above-described electric discharge space, to be hardly exhausted through a reactive-species output port through which at least the above-described reactive species is to be outputted.

(28) The above-described protective-gas handling portion may include a protective-gas exhausting portion that is configured to exhaust the above-described protective gas to an exterior of the above-described reactive-species supply device.

(29) The above-described protective-gas handling portion may include a protective-gas outlet passage which is disposed on a downstream side of the above-described electric discharge space and which has an opening opposed to the electric discharge space.

The protective-gas outlet passage may be a protective-gas exhaust passage.

Where the protective gas is supplied to the inside of each electrode cover and emitted to the electric discharge space through the electric-discharge opening, the protective-gas outlet passage may be provided such that its opening is located in vicinity of the electric-discharge opening.

(30) The above-described protective-gas handling portion may be provided with a dust separating portion configured to separate dust from a gas which has been supplied to the above-described electrodes and caused to outflow.

Since the dust or the like is caused to outflow together with the protective gas, the dust is separated, by the dust separating portion, from the protective gas. The dust separating portion may be referred also to as a dust collecting portion, and may be adapted to include a pocket or a filter.

It is noted that there are a case where the dust is in a solid state and a case where the dust is in a gaseous state.

(31) The above-described dust separating portion may include at least one pocket portion that is disposed in the above-described protective-gas outlet passage.

It is preferable that the pocket portion is disposed to be adjacent to a lower portion of the protective-gas outlet passage.

(32) The above-described protective-gas handling portion may include a recycling portion configured to collect the above-described protective gas and recycle the protective gas.

(33) The above-described protective-gas handling portion may include a protective-gas outlet portion configured to cause a protective gas that has been supplied to an inside of each of the above-described electrode covers, to outflow to an outside of the each of the electrode covers.

The protective-gas outlet portion may be adapted to include a protective-gas outlet port or an electric-discharge opening.

(34) The above-described reactive-species supply device may include a reactive-species output port through which the above-described reactive species is to be outputted, and the above-described protective-gas supplying portion may include a protective-gas exhaust passage, wherein an end of the protective-gas exhaust passage serves as an entry port disposed to be adjacent to a portion of one of the above-described electrode covers in which one of the above-described electric-discharge openings is provided, and wherein another end of the protective-gas exhaust passage serves as an exhaust port disposed in a position that is distant from the reactive-species output port.

The exhaust port is disposed in a position that is distant from the reactive-species output port. It is preferable that the exhaust port is disposed such that the protective gas is to be exhausted through the exhaust port in a direction different from a direction of irradiation of a gas containing the reactive species outputted through the reactive-species output port.

(35) The above-described reactive-species supply device includes a plurality of individual outlet passages which are disposed on a downstream side of the above-described electric discharge space and which have a plurality of discharge-space-side openings arranged between each adjacent two of the above-described electrodes, and each of opposite-end ones of the above-described individual outlet passages is in communication with the above-described exhaust port while each of intermediate ones of the individual outlet passages located between the opposite-end ones is in communication with the above-described reactive-species output port.

(36) The above-described reactive-species supply device may be provided with a confluence device that is configured to cause the above-described protective gas and the above-described treatment gas to flow together with each other.

(37) The above-described treatment gas contains a plurality of kinds of gases, while the above-described protective gas is the same as at least one of the above-described plurality kinds of gases.

(38) The above-described treatment gas contains a carrier gas and a reaction gas, while the above-described protective gas acts as a carrier gas.

The carrier gas is a gas having a low reactivity or a gas hardly activated. For example, the carrier gas is a gas that hardly reacts with a plasma or a gas that is hardly activated by an electric discharge. The carrier gas is used mainly for carrying a reactive species.

The protective gas may be either a gas that is different from the carrier gas contained in the treatment gas or a gas that is the same as the carrier gas contained in the treatment gas, as long as the protective gas acts as a carrier gas.

The protective gas may be an inactive gas (such as helium gas, neon gas and argon gas), may be nitrogen gas, fluorine gas or the like, or may be a mixture of these gases.

Further, the carrier gas of the treatment gas may be, for example, nitrogen gas or fluorine gas, or may be an inactive gas or the like (such as helium gas, neon gas, argon gas and the like).

The reaction gas is a substance that serves as the reactive species by being supplied to an electric discharge region. The reaction gas becomes the reactive species, for example, by being excited by its collision with a charged particle in a plasma or by being exited by an electric discharge. The reaction gas may be oxygen gas, hydrogen gas, fluorine gas to or the like. The kind of reaction gas to be used is determined depending on a material of the object, a purpose of the treatment and other factors.

It is noted that the kinds of the carrier gas and protective gas to be used are determined depending on the material of the object, a material of the electrodes, the purpose of the treatment, the kind of the reaction gas and other factors.

(39) The above-described treatment gas contains a reaction gas and a carrier gas, while the above-described protective gas is the same in kind as the carrier gas contained in the treatment gas.

(40) The above-described protective gas contains substantially no oxygen gas.

It is preferable that the protective gas is a gas in which a content percentage of oxygen gas is not higher than a given value (e.g., 0.01%).

(41) The above-described reactive-species supply device may include a reactive-species outlet passage disposed in a downstream side of the above-described electric discharge space.

(42) The above-described reactive-species outlet passage is shaped to be curved in a midway thereof.

The reactive-species outlet passage is shaped to be curved in at least one portion thereof. The reactive-species outlet passage may be curved in either one or two portions thereof. Further, an angle of the curvature may be 90°, smaller than 90° or larger than 90°.

(43) The above-described reactive-species outlet passage may have at least one recessed portion.

(44) The above-described reactive-species output port is adapted to have a slit-like shape.

(45) The above-described reactive-species output port is constituted by a slit that is elongated in a direction in which the above-described electrodes are arranged.

(46) The above-described reactive-species outlet passage may include a diffusing portion in a midway thereof.

(47) The above-described reactive-species outlet passage may include (a) a plurality of individual passages having a plurality of openings that open in the electric discharge space, (b) a diffusing portion connected to the plurality of individual passages and (c) a slit passage connected to the diffusing portion and having an opening that is constituted by a slit.

The reactive-species output port may be constituted by a plurality of openings. In this case, a plurality of outlet-side individual passages in place of the slit passage are connected to the diffusing portion.

(48) Each of the above-described individual passages has an opening opposed to the above-described electric discharge space, wherein the above-described opening is located in a center of the above-described electric discharge space in a direction of a width of the above-described electric discharge space and has a diameter that is smaller than the above-described width of the above-described electric discharge space.

The number of the individual passages of the reactive-species outlet passage that is disposed on a downstream side of a single electric discharge space, is larger than the number of treatment-gas supply passages that are disposed on an upstream side of the electric discharge space, and a diameter of the individual passages of the reactive-species outlet passage is smaller than a diameter of openings of the treatment-gas supply passages.

(49) The above-described diffusing portion may be shaped to diffuse the reactive species, away from a connection portion thereof at which the diffusing portion is connected to the above-described individual passages, toward a connection portion thereof at which the diffusing portion is connected to the above-described slit passage.

(50) Each of the above-described individual passages has a connection portion at which each of the individual passages is connected to the above-described diffusing portion, wherein the connection portion of each of the individual passages is shaped such that a cross-sectional size of the connection portion is gradually increased.

For example, a diameter of each individual passage may be gradually increased.

(51) The above-described reactive-species supply device may be provided with an earth ground member that is disposed on a downstream side of the above-described electric discharge space.

The downstream side of the electric discharge space is interpreted to mean a portion of the reactive-species supply device that is located between a portion in which the electric discharge space is defined and the reactive-species output port through which the reactive species is to be outputted.

(52) The above-described earth ground member may be disposed in a reactive-species outlet passage that is disposed between the above-described electric discharge space and a reactive-species output port through which at least the above-described reactive species is to be outputted.

(53) The above-described reactive-species outlet passage has a main passage communicating the above-described electric discharge space and the reactive-species output port through which the above-described reactive species is to be outputted, and a branch passage connected to the main passage, wherein the above-described earth ground member is provided to close the branch passage.

(54) The above-described main passage includes (a) a first passage extending in a first direction and (b) a second passage connected to the first passage and extending in a second direction that is inclined with respect to the first direction, while the above-described branch passage is constituted by a straight passage connected to a connection between the first and second passages and extending along a line along which the first passage extends.

It can be considered that the branch passage is an extension of the first passage.

The first and second passages may or may not intersect with each other at a right angle.

The first and second directions may or may not intersect with each other at a right angle.

(55) The above-described earth ground member is disposed such that the earth ground member is contactable with a gas which contains the reactive species and which flows in the above-described reactive-species outlet passage.

(56) The above-described earth ground member may be disposed in a midway of the above-described reactive-species outlet passage.

(57) The above-described earth ground member may be disposed in a position that is distant, by a given distance, from a reactive-species output port through which the reactive species is to be outputted.

For example, the given distance may be a distance which is considered to not cause an electric discharge between the earth ground member and a treatment surface of the object in an assumed case when the reactive-species output port and the treatment surface are in contact with each other, or may be a distance which is considered to not cause an electric discharge between the earth ground member and the treatment surface in a case when the reactive-species output port and the treatment surface are being distant from each other by a distance that is suitable for the treatment.

The given distance is predetermined by experiments, simulations or the like. The given distance is determined depending on mainly the material of the object.

The probability of occurrence of the electric discharge between the earth ground member and the object is dependent on a shortest distance between the treatment surface of the object and the earth ground member. Where the reactive-species supply device is used with a posture of the main body that causes the distance (i.e., shortest distance) between the reactive-species output port and the earth ground member to be larger than (or substantially equal to) the shortest distance between the treatment surface and the earth ground member, the probability of occurrence of the electric discharge between the earth ground member and the workpiece W can be made low, by disposing the earth ground member in such a position that causes the distance between the reactive-species output port and the earth ground member to be not smaller than the above-described given distance.

(58) The above-described reactive-species outlet passage includes a plurality of openings that are opposed to the above-described electric discharge space, wherein each of the plurality of openings has a diameter that is not larger than 3 mm.

The diameter of each of the openings may be not larger than 2.5 mm, not larger than 2 mm, not larger than 1.5 mm or not larger than 1 mm.

(59) The above-described reactive-species supply device may be provided with an electrically neutralizing mechanism which is disposed on a downstream side of the above-described electric discharge space and on an upstream side of the above-described reactive-species output port and which is configured to convert a gas containing at least the above-described reactive species supplied through the above-described reactive-species output port, into an electrically neutral gas.

Where the object is an electronic component such as a substrate, it is not preferable that a gas that is positively or negatively charged as a whole is supplied to the object because the object is also charged.

Therefore, it is preferable to avoid supply of a gas that is not electrically neutral as a whole, to the object. It is preferable that, when the charged gas is flowing in the reactive-species outlet passage, the charged gas is electrically neutralized and then supplied to the object.

The electrically neutralizing mechanism may be constituted by for example, a mechanism including an earth ground plate. By contact of the charged gas and the earth ground plate, electrons are transferred therebetween whereby the gas is at the same potential with the earth ground plate. Consequently, it is possible to cause the gas, which is charged, to be hardly supplied to the object, or avoid the charged gas from being supplied to the object.

(60) The above-described reactive-species supply device may be provided with a treatment-gas supplying portion that is configured to supply the above-described treatment gas to the above-described electric discharge space.

(61) The above-described treatment-gas supplying portion is provided for each electric discharge space, and includes corresponding-discharge-space-directed treatment-gas supplying portions each of which is configured to supply the above-described treatment gas to a corresponding electric discharge space.

(62) The above-described treatment-gas supplying portion includes (a) a main passage which is connected to a treatment-gas supply port provided in the above-described reactive-species supply device and (b) an individual passage which is connected to the main passage and which is provided for the above-described electric discharge space.

Where a plurality of electric discharge spaces are provided, a plurality of individual passages are also provided. The individual passage may be referred also to as a corresponding-discharge-space-directed passage.

(63) The above-described individual passage includes (a) an upstream-side passage having a connection portion that is connected to the above-described main passage, (b) a diffusing portion and (c) a plurality of downstream-side passages that are spaced apart from each other in a direction of a width of the above-described electric discharge space.

The width direction of the electric discharge space corresponds to a direction in which the electrodes are spaced apart from each other.

(64) The above-described downstream-side passages have respective openings that are opposed to the electric discharge space, wherein a diameter of each of the openings is substantially equal to a size of the electric discharge space that is measured in the direction of the width of the electric discharge space.

(65) A sum of areas of the openings of the above-described downstream-side passages is larger than a sum of areas of openings of a plurality of individual passages which are included in the above-described reactive-species outlet passage, the openings of the plurality of individual passages being opposed to the electric discharge space.

(66) The above-described reactive-species supply device may be provided with both of a treatment-gas supplying portion and a protective-gas supplying portion, the treatment-gas supplying portion being configured to supply the treatment gas to the above-described electric discharge space, the protective-gas supplying portion being configured to supply the above-described protective gas to the above-described electrodes.

(67) The above-described plurality of electrodes may be held in the above-described reactive-species supply device such that parts of the respective electrodes protrude from a same surface of a main body of the reactive-species supply device.

For example, where the main body of the reactive-species supply device has a generally rectangular parallelepiped shape, the part of each of the electrodes protrudes from the same surface such as a side or upper surface of the main body.

(68) The above-described plurality of electrode covers may be held in the above-described reactive-species supply device such that parts of the respective electrode covers protrude from a same surface of a main body of the reactive-species supply device.

Each of the electrode covers may be made of a material, such as ceramics or the like, which serves as an insulating body.

(69) A reactive-species supply device configured to supply a treatment gas to an electric discharge space, for thereby supplying at least a reactive species formed in a plasma, to an object through a reactive-species output port, the reactive-species supply device comprising:

at least one pair of electrodes configured to form the electric discharge space;

a protective-gas supplying portion configured to supply a protective gas to each of the electrodes; and a protective-gas exhaust passage, such that an end of the protective-gas exhaust passage serves as an opening located in vicinity of each of the electrodes, and such that another end of the protective-gas exhaust passage serves as an exhaust port disposed in a position that is distant from the reactive-species output port.

The technical features described in any one of the above-described modes (1)-(68) can be employed in the reactive-species supply device described in this mode.

(70) A reactive-species supply device configured to supply a treatment gas to an electric discharge space, for thereby supplying at least an activated species formed in a plasma, to an object.

The activated species is interpreted to mean an molecule, atom, ion or the like that has been transited to a state with a high energy or to a state with a high probability of its chemical reaction or change of its crystal grating. There is also a case where a desired treatment is performed by irradiating positive or negative ions onto a treatment surface of the object.

The technical features described in any one of the above-described modes (1)-(69) can be employed in the reactive-species supply device described in this mode.

(71) A surface treatment apparatus configured to perform a treatment on a surface or the like of an object, and comprising a reactive-species-supply-device holding portion that holds the above-described reactive-species supply device, an object holding portion that is configured to hold the above-described object and a relative movement device that is configured to relatively move the reactive-species-supply-device holding portion and the object holding portion.

In the surface treatment apparatus, the treatment is performed on a surface or the like of the object by the relative movement of the object and the reactive-species supply device. In the surface treatment apparatus, although the treatment is performed on the surface of the object with supply of at least the reactive species to the surface, there is a case where not only the surface of the object but also an interior of the object is influenced by the treatment, namely, there is a case where a chemical reaction occurs not only in the surface of the object but also in the interior of the object.

In the surface treatment apparatus, the object and the reactive-species supply device may be relatively moved in a continuous manner, namely, while the reactive species are being irradiated onto the object.

The relative movement device may be constructed such that the reactive-species-supply-device holding portion is unmovable while the object is holding portion is movable, or such that the reactive-species-supply-device holding portion is movable while the object holding portion is unmovable, or such that the reactive-species-supply-device holding portion and the object holding portion are both movable.

It is noted that, in the surface treatment apparatus, the reactive species may be irradiated onto the treatment surface from a direction intersecting the treatment surface.

(72) The above-described relative movement device includes a parallel moving portion configured to relatively move the above-described reactive-species-supply-device holding portion and the above-described object holding portion in a direction parallel to a surface of the above-described object that is to be subjected to a treatment.

(73) The above-described relative movement device includes a perpendicular moving portion configured to relatively move the above-described reactive-species-supply-device holding portion and the above-described object holding portion in a direction perpendicular to a surface of the above-described object that is to be subjected to a treatment.

(74) In the above-described surface treatment apparatus, the above-described reactive species is supplied to the object in an atmosphere.

EMBODIMENTS FOR CARRYING OUT THE INVENTION

Figure 1:
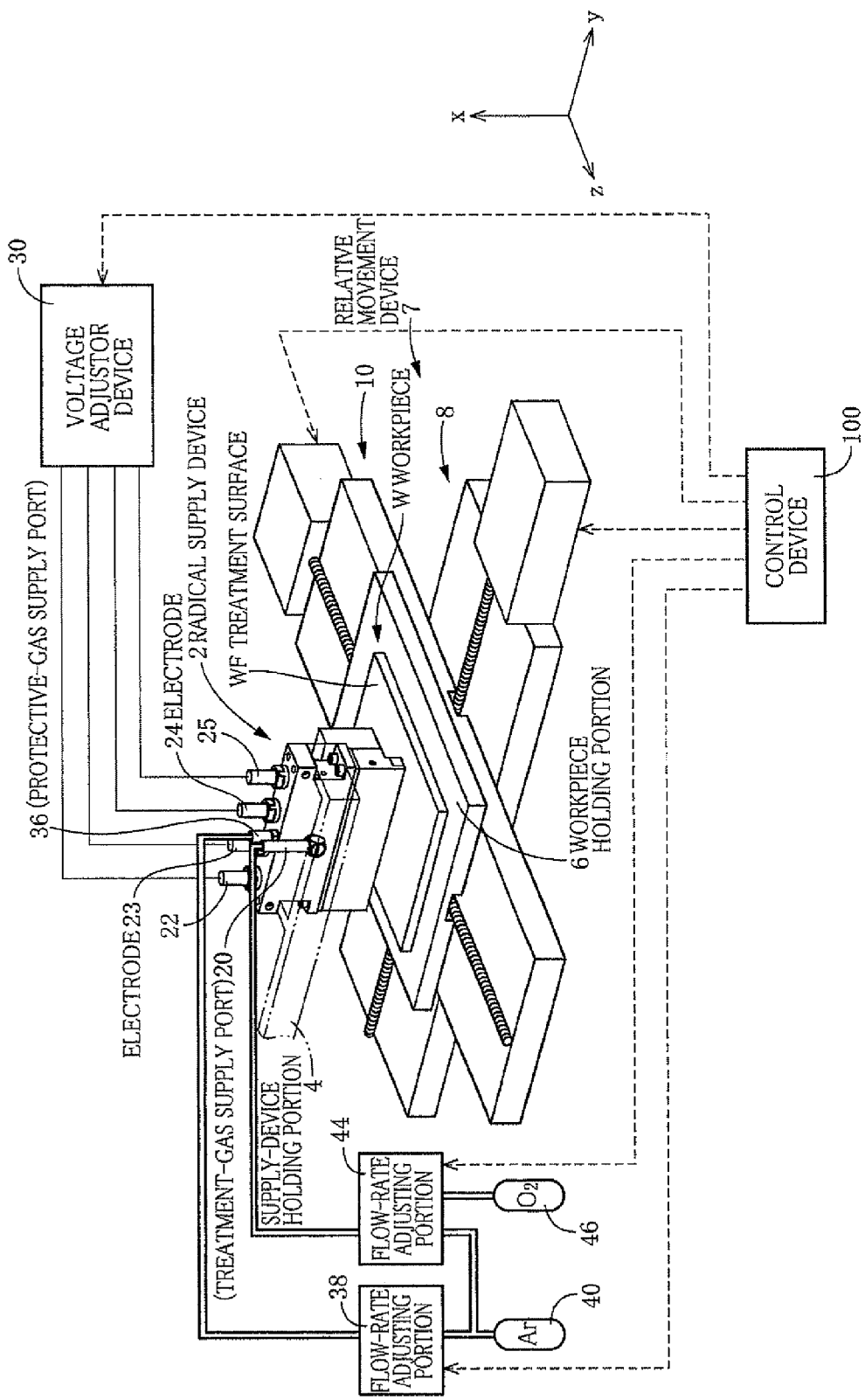
FIG. 1 is a view schematically showing an entirety of a surface treatment apparatus that is an embodiment of the present invention, wherein the surface treatment apparatus is provided with a reactive-species supply device in the form of a radical supply device that is an embodiment of the present invention (Embodiment 1).

Hereinafter, a surface treatment apparatus as an embodiment of the present invention will be described with reference to drawings. The surface treatment apparatus includes a radical supply device as a reactive-species supply device that is an embodiment of the present invention.

The surface treatment apparatus is configured to irradiate reactive species or the like onto a treatment surface (that may be referred also to as a surface subjected to a treatment) of an object (hereinafter referred to as a workpiece), for thereby performing modification, cleaning or other treatment (that may be referred to as a plasma treatment or surface treatment). The reactive species is caused to react with the workpiece as such or with a substance adhering onto a surface of the workpiece, so as to modify the workpiece surface or clean the workpiece surface (i.e., dissolve and remove organic substance on the workpiece surface). There is a case where not only the surface but also an interior of the workpiece is influenced by the reaction of the reactive species and workpiece.

In the surface treatment apparatus, it is possible to, for example, increase bond strength, hydrophilicity, or water repellency of the treatment surface of the workpiece, sterilize or disinfect the treatment surface of the workpiece, or remove organic substance from the treatment surface of the workpiece.

Further, the workpiece may be made of metal, resin or ceramic, and may constitute, for example, a printed substrate, a liquid crystal substrate or an electronic component.

In the present embodiment, the reactive species is interpreted to mean an electrically neutral particle such as excited atom or molecule, for example, mean a radical or other excited species having a high reactivity.

The excitation is interpreted to mean a transition from a ground state with a low energy to a state with a high energy. For example, an atom or molecule is excited by an electric discharge or excited by collision of the atom or molecule with a charged particle in a plasma. Hereinafter, in the present specification, it will be referred to as an excitation as a result of an electric discharge, where appropriate, irrespective of whether the atom or molecule is excited actually by the electric discharge or by collision with a charged particle. Further, the reactive species obtained by the excitation as a result of the electric discharge corresponds to reactive species formed in the plasma.

The radical is interpreted to mean a chemical species having an unpaired electron, and is referred also to as a free radical.

The plasma is interpreted to mean a state established by an electric discharge or an insulation breakdown, and mean a matter which is electrically neutral as a whole and which contains a charged particle such as a positive or negative ion and a neutral particle or electron such as a radical.

The surface treatment apparatus as an embodiment of the present invention is configured to generate a plasma, and to supply a radical or the like as a reactive species contained in the plasma, to a surface of a workpiece, for thereby performing a treatment. The surface treatment apparatus is also suitable for performing a plasma treatment onto a workpiece by relative movement of the workpiece and the radical supply device. The surface treatment apparatus may be referred also to as a plasma treatment apparatus.

Embodiment 1

Surface Treatment Apparatus

As shown in FIG. 1, the surface treatment apparatus includes (1) a radical supply device 2 as a reactive-species supply device, (2) a supply-device holding portion 4 that holds the radical supply device 2, (3) a workpiece holding portion 6 that holds a workpiece W and (4) a relative movement device 7 that is configured to move the supply-device holding portion 4 and the workpiece holding portion 6 relative to each other.

In the present embodiment, the radical supply device 2 is used while being held in a posture as shown in FIG. 1. An X direction corresponds to an upward and downward direction (i.e., vertical direction), while a Y direction corresponds to a width direction. Further, a Z direction is a direction perpendicular to the X direction and Y direction.

The supply-device holding portion 4 is attached to a main body (not shown) of the surface treatment apparatus such that the supply-device holding portion 4 is movable in the X direction. The workpiece holding portion 6 is attached to a relative movement device 7 such that the workpiece holding portion 6 is movable in the Y direction and Z direction. The relative movement device 7 includes a Y-direction movement device 8 and a Z-direction movement device 10. The Y-direction movement device 8 includes a Y-direction driving device (i.e., motor), a motion converting mechanism and a guide member. The Z-direction movement device 10 includes a Z-direction driving device (i.e., motor), a motion converting mechanism and a guide member.

In the present embodiment, the workpiece W is held by the workpiece holding portion 6 to take a posture that causes its treatment surface WF to be parallel with a YZ plane (i.e., a plane perpendicular to an X axis).

A radical output port 16 as a reactive-species output port is provided in a lower surface 14 (see FIG. 3) of the radical supply device 2. With movement of the supply-device holding portion 4 in the X direction, a distance between the radical output port 16 and the treatment surface WF of the workpiece W in the X direction is made equal to a target value (for example, an extremely small value).

In this state, at least the radical is outputted from the radical output port 16, and the workpiece holding portion 6 is moved in the Z direction and/or Y direction, whereby the outputted radical is supplied to an entirety of the treatment surface WF of the workpiece W.

In the present embodiment, at least radical is supplied from a direction substantially perpendicular to the treatment surface WF, and the surface treatment of the workpiece W is performed under an atmospheric pressure (i.e., in an atmosphere).

It is noted that, in the surface treatment apparatus, the supply-device holding portion 4 may be provided to be movable in the Y and Z directions, or at least one of the supply-device holding portion 4 and workpiece holding portion 6 may be provided to be movable in the X, Y and Z directions.

Further, at least one of the supply-device holding portion 4 and workpiece holding portion 6 may be provided to be rotatable, relative to a main body of the surface treatment apparatus, about an axis extending in the X direction.

Moreover, each of the radical supply device 2 and the treatment surface WF of the workpiece W may be held to have a posture that is inclined with respect to the X direction, Y direction and/or Z direction.

[Radical Supply Device]

Figure 2:
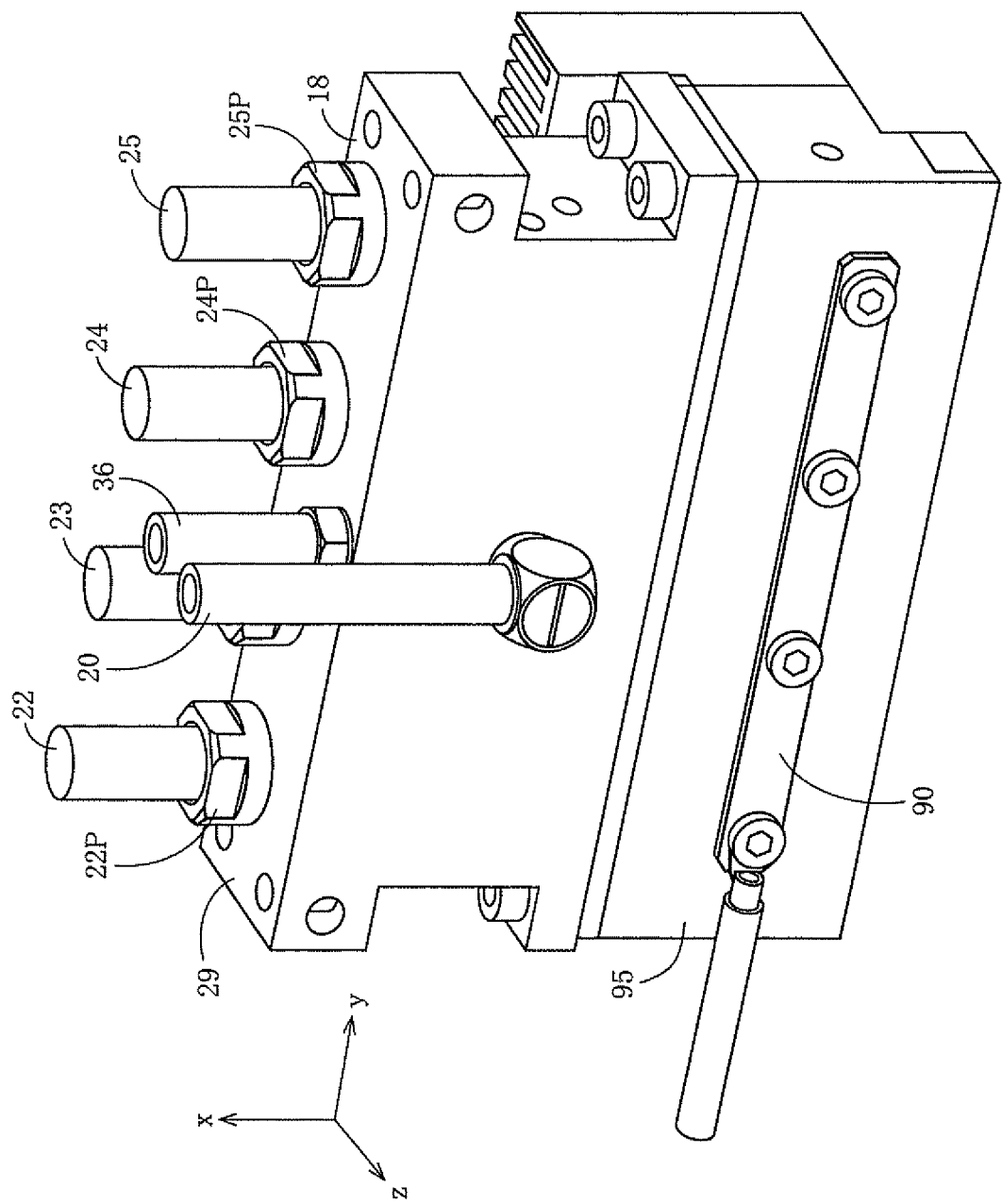
FIG. 2 is an overall perspective view showing the above-described radical supply device.

As shown in FIG. 2, the radical supply device 2 includes a main body 18 having a generally rectangular parallelepiped shape, a treatment-gas supply port 20 provided in the main body 18, and electrodes 22, 23, 24, 25 held by the main body 18. The radical supply device 2 is configured to supply a treatment gas having been supplied through the treatment-gas supply port 20, to electric discharge spaces defined by the electrodes 22-25, and to output radicals formed in a plasma, through the radical output port 16.

In the present embodiment, the treatment gas contains oxygen and argon. The oxygen gas as a reaction gas is excited as a result of an electric discharge whereby oxygen radicals (hereinafter referred simply to as radicals) are formed. The formed oxygen radicals are carried to the radical output port 16, mainly, by the argon as the carrier gas.

Thus, the radicals (i.e., neutral particles formed in the plasma) and the carrier gas are outputted from the radical output port 16, although there is a case when the plasma (i.e., aggregate which contains charged particles such as positive and negative ions, radicals, electrons and the like and which is electrically neutral as a whole) and the carrier gas are outputted.

Hereinafter, in the present specification, it will be referred to as output of the radicals or the like or gas containing the radicals or the like from the radical output port 16 of the radical supply device 2.

It is noted that, for example, where the workpiece is an electronic component such as a substrate, it is not preferable that a positively or negatively charged substance is supplied to the electronic component because the electronic component is charged. On the other hand, even if a substance containing charged particles is supplied to the electronic component, it is possible to restrain or prevent the electronic component from being charged, as long as the substance is not charged as a whole. Therefore, even if the plasma is supplied to the workpiece, the workpiece is little affected.

<Electrodes, Electrode Covers>

As shown in FIGS. 2-5, each of the electrodes 22, 23, 24, 25 has an elongated shape, i.e., a bar-like shape. The electrodes 22, 23, 24, 25 are arranged at a constant spacing interval in the Y direction and parallel with one another such that a longitudinal direction of each of the electrodes 22, 23, 24, 25 corresponds to the X direction.

The electrodes 22-25 are covered by respective electrode covers 22P-25P. The electrodes 22-25 are made of stainless steels while the electrode covers 22P-25P are made of solid dielectric such as ceramics.

The electrodes 22-25 and the electrode covers 22P-25P are held by the main body 18 of the radical supply device 2, such that an end portion of each of the electrodes 22-25 and electrode covers 22P-25P protrudes from an upper surface 29 of the main body 18 (see FIG. 2) while another end portion of each of the electrodes 22-25 and electrode covers 22P-25P is fitted in a recessed portion that is provided in the main body 18.

The electrodes 22-25 have respective protruding portions which are located on the upper surface 29 and which protrude from the respective electrode covers 22P-25P. The protruding portions of the electrodes 22-25 are connected to a voltage adjustor device 30, which includes a power supply unit and an electric transformer and which is configured to apply an alternating voltage adjusted to a target effective voltage or the like, to each of the electrodes 22-25. In the present embodiment, the voltage adjustor device 30 is controlled to establish alternately two states, one of which is (i) a state where a positive voltage is applied to each of the electrodes 22, 24 while a negative voltage is applied to each of the electrodes 23, 25, and the other of which is (ii) a state where the negative voltage is applied to each of the electrodes 22, 24 while the positive voltage is applied to each of the electrodes 23, 25.

It is noted that it is also possible to employ (a) an arrangement in which a voltage is applied to each of the electrodes 23, 25 while the electrodes 22, 24 are grounded, or (b) an arrangement in which a voltage is applied to each of the electrodes 22, 24 while the electrodes 23, 25 are grounded.

Further, as shown in FIG. 2, the electrode covers 22P-25P also protrude from the upper surface 29 of the radical supply device 2.

If the electrode covers 22P-25P were not provided to protrude from the upper surface 29, an electric discharge could be easily caused between each adjacent two of the electrodes 22-25. For avoiding it, it might be possible to employ an arrangement, for example, in which the electrodes 22-25 extend in the Z direction such that the electrodes 22, 24 protrude from a front surface while the electrodes 23, 25 protrude from a back surface. However, in such an arrangement in which the electrodes 22, 24 and electrodes 23, 25 protrudes from the surfaces different from each other, there would be a problem that the radical supply device 2 is made large in size, for example.

On the other hand, in the present embodiment in which the electrode covers 22P-25P also protrude from the surface, each of the electrode covers 22P-25P is located between proximal portions of the respective protruding portions of corresponding adjacent two of the electrodes 22-25, so that an electric discharge is hardly caused between the protruding portions of each adjacent two of the electrodes 22-25. Consequently, the electrodes 22-25 can be provided to protrude from the same surface, so that the radical supply device can be made compact in size and so that maintenance operations such as replacement of electrode can be easily carried out.

Figure 3:
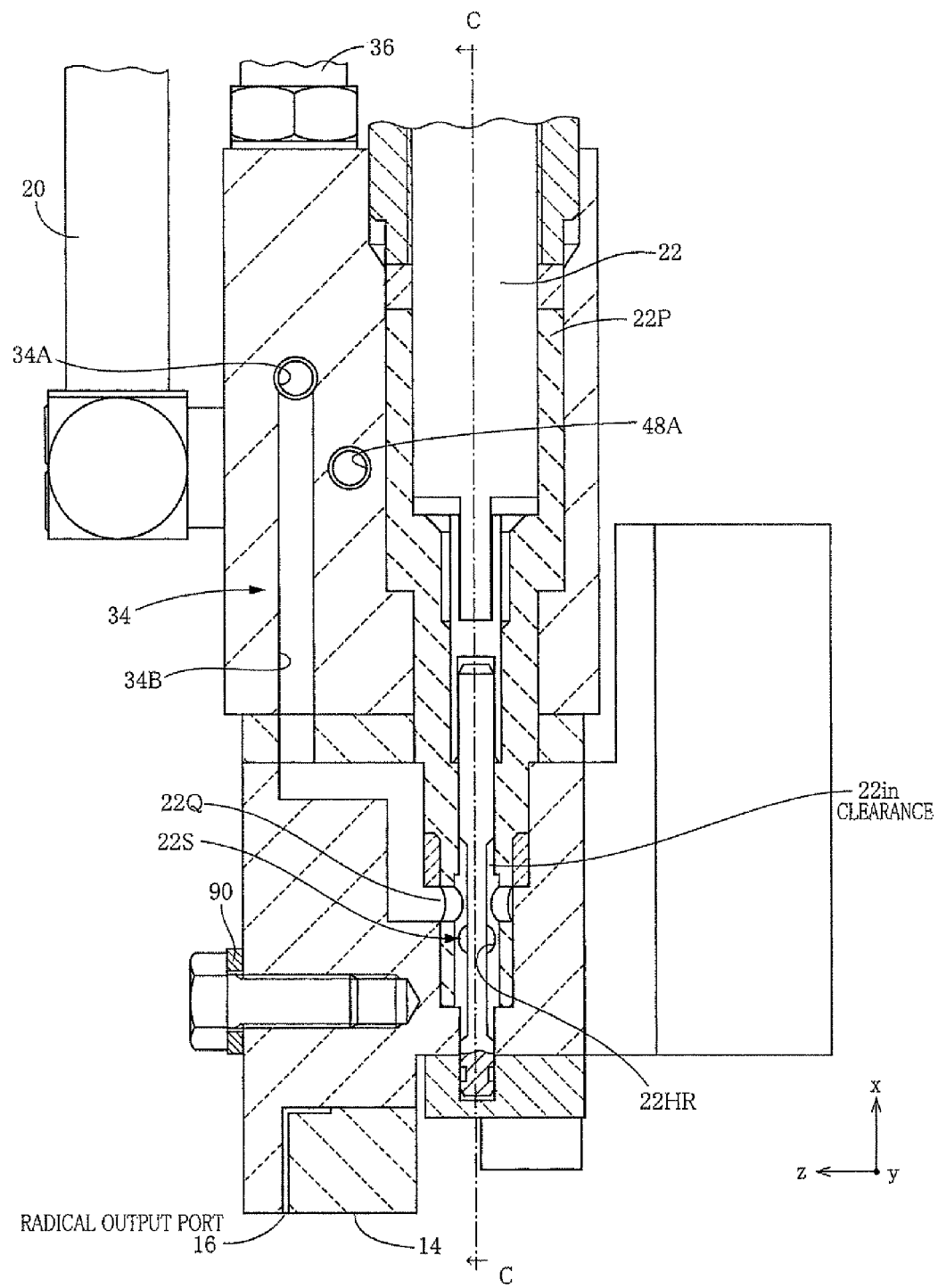
FIG. 3 is a cross sectional view taken along line A-A of FIG. 6.
Figure 5:
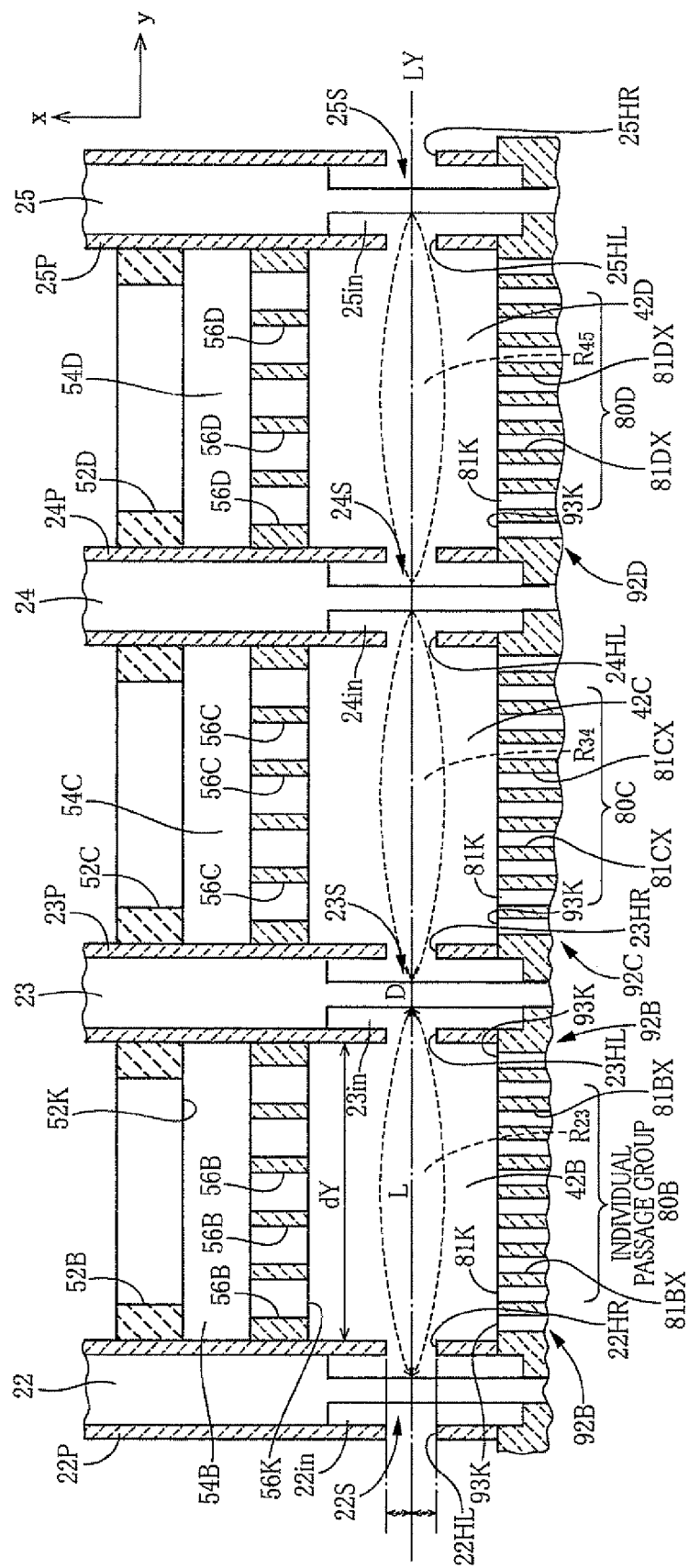
FIG. 5 is a view showing a periphery of each electric discharge space in the above-described radical supply device.

As shown in FIG. 3, each of the electrode covers 22P-25P and electrodes 22-25 includes a large diameter portion and a small diameter portion so as to have a stepped shape. The large diameter portion of each of the electrodes 22-25 is fitted in the large diameter portion of each of the electrode covers 22P-25P. Further, in this state, as shown in FIGS. 3 and 5, each of clearances 22in-25in is defined between an inner circumferential surface of a part of the small diameter portion of a corresponding one of the electrode covers 22P-25P and an outer circumferential surface of a part of the small diameter portion of a corresponding one of the electrodes 22-25.

The part of the small diameter portion of each of the electrode covers 22P-25P defining the clearances 22in-25in has a corresponding one of pairs of electric-discharge openings 22HL, 22HR 25HL, 25HR, which are diametrically spaced apart from each other (i.e., spaced apart from each other circumferentially by 180° about a center axis). The electric-discharge openings 22HL, 22HR-25HL, 25HR are located in the same position in the X direction, so that corresponding portions (for example, centers of the respective electric-discharge openings 22HL, 22HR 25HL, 25HR) of the respective electric-discharge openings 22HL, 22HR

25HL, 25HR, which correspond to one another, lie on a straight line (i.e., line LY extending in the Y direction).

An electric discharge could be caused in an entirety of each of the electrodes 22-25 upon application of an electric voltage thereto. However, the electric discharge is less likely to be caused in a covered portion of each of the electrodes 22-25 (which is covered at its outer circumferential surface by a corresponding one of the electrode covers 22P-25P), than in an uncovered portion of each of the electrodes 22-25 (i.e., portion corresponding to the electric-discharge openings). Thus, upon application of an electric voltage of each of the electrodes 22-25, an electric discharge is caused in the uncovered portion of each of the electrodes 22-25 which corresponds to a corresponding one of pairs of electric-discharge openings 22HL, 22HR 25HL, 25HR. In this sense, the portion of each of the electrodes 22-25, which correspond to a corresponding one of pairs of electric-discharge openings 22HL, 22HR 25HL, 25HR, serves as a corresponding one of electric-discharge electrode portions 22S-25S. In the present embodiment, portions (for example, centers of the respective electric-discharge openings 22HL, 22HR-25HL, 25HR) which are included in the respective electric-discharge electrode portions 22S-25S and which correspond to one another, lie on a straight line extending in the Y direction.

If the electric-discharge openings were not provided with presence of the clearances 22in-25in between the electrode covers 22P-25P and the electrodes 22-25, an electric discharge would be caused between each adjacent two of the electrodes 22-25, penetrating through corresponding ones of the electrode covers 22P-25P. In this case, the electrode covers 22P-25P would be deteriorated whereby the service life would be reduced.

On the other hand, with provision of the electric-discharge openings 22HL, 22HR-25HL, 25HR, an electric discharge is caused between each adjacent two of the electric-discharge electrode portions 22S-25S, so that it is possible to restrain deterioration of each of the electrode covers 22P-25P and to increase the service life.

Further, in the above case where the electric discharge is caused with the penetration through the electrode covers 22P-25P, a high electric voltage is required to start the electric discharge. On the other hand, the provision of the electric-discharge openings 22HL, 22HR-25HL, 25HR provides an advantage that an electric voltage required to cause the electric discharge can be reduced.

Further, in the present embodiment, each of the electric-discharge electrode portions 22S-25S has a diameter D (i.e., width as measured in the Y direction) that is smaller than a distance L (i.e., distance as measured in the Y direction) between each adjacent two of the electrodes 22-25 (D<L). Therefore, a dimension of electric discharge space as measured in the Y direction can be increased while the radical supply device as a whole can be made compact in size.

A ratio D/L of the diameter D to the distance L may be not larger than 0.7, not larger than 0.5, not larger than 0.3, not larger than 0.1 or not larger than 0.05.

<Supply of Protective Gas>

A protective gas is supplied to a surface of each of the electric-discharge electrode portions 22S-25S. Although argon gas is used as the protective gas in the present embodiment, the protective gas may be an inactive gas (such as helium gas and neon gas), or may be nitrogen gas or fluorine gas, or may be a gas in which a content percentage of oxygen is extremely low (i.e., the content percentage of oxygen is not higher than a given value), or may be a mixture of these gases.

As shown in FIG. 3, a protective-gas inlet port 22Q is provided in a portion of the electrode cover 22P, which is located in a position distant from the electric-discharge openings 22HL, 22HR in the X direction (i.e., a position above the electric-discharge openings 22HL, 22HR). The protective-gas inlet port 22Q is connected to a protective-gas supply passage 34. Described in detail, openings are formed to penetrate the electrode cover 22P in a diametric direction, and one of the openings is closed by the main body 18 while the other of the openings serves as the protective-gas inlet port 22Q. The position of the protective-gas inlet port 22Q is circumferentially offset (in phase) from each of the electric-discharge openings 22HL, 22HR by 90° about the center axis.

Figure 6:
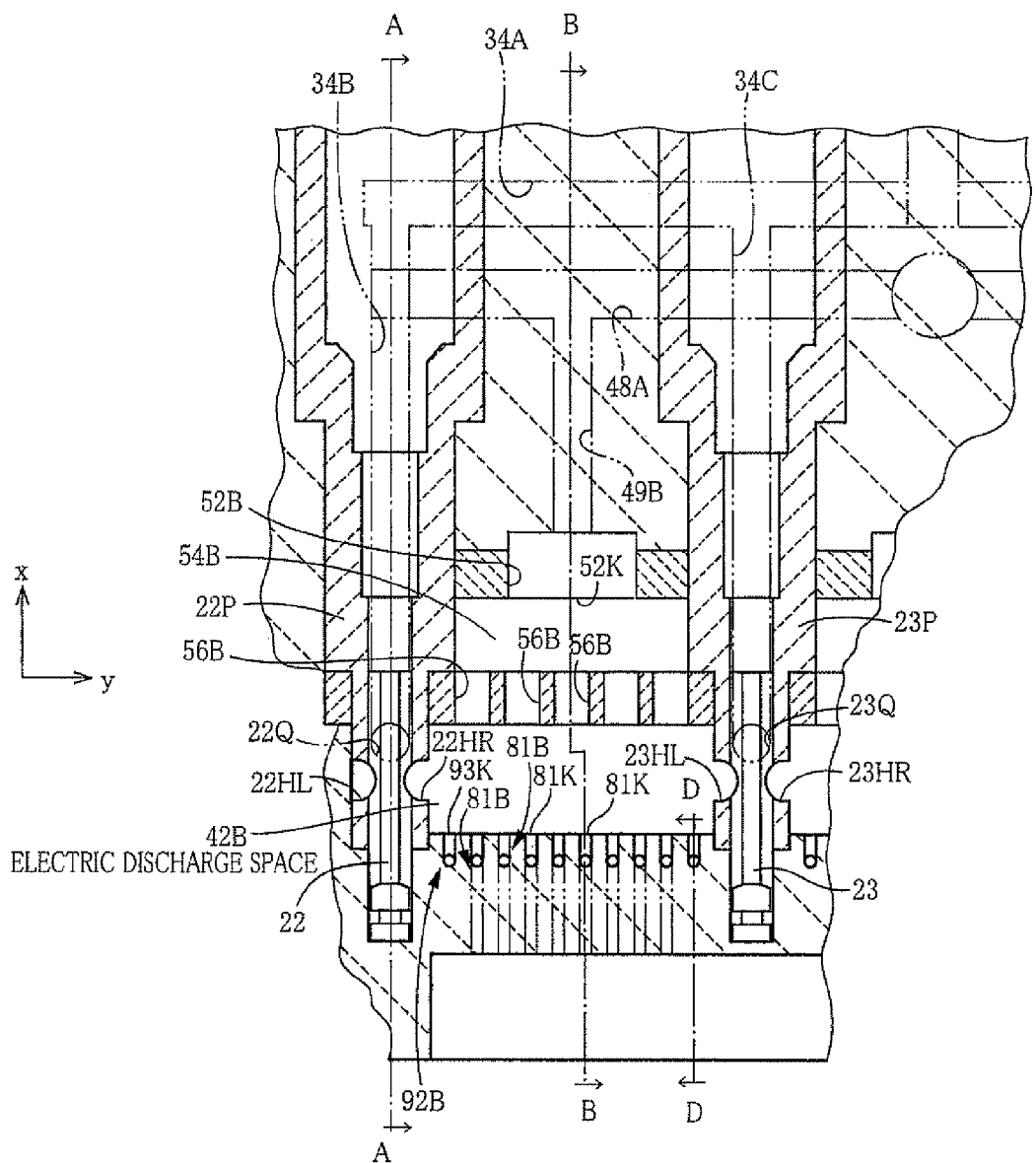
FIG. 6 is a cross sectional view taken along line C-C of FIG. 3.
Figure 7:
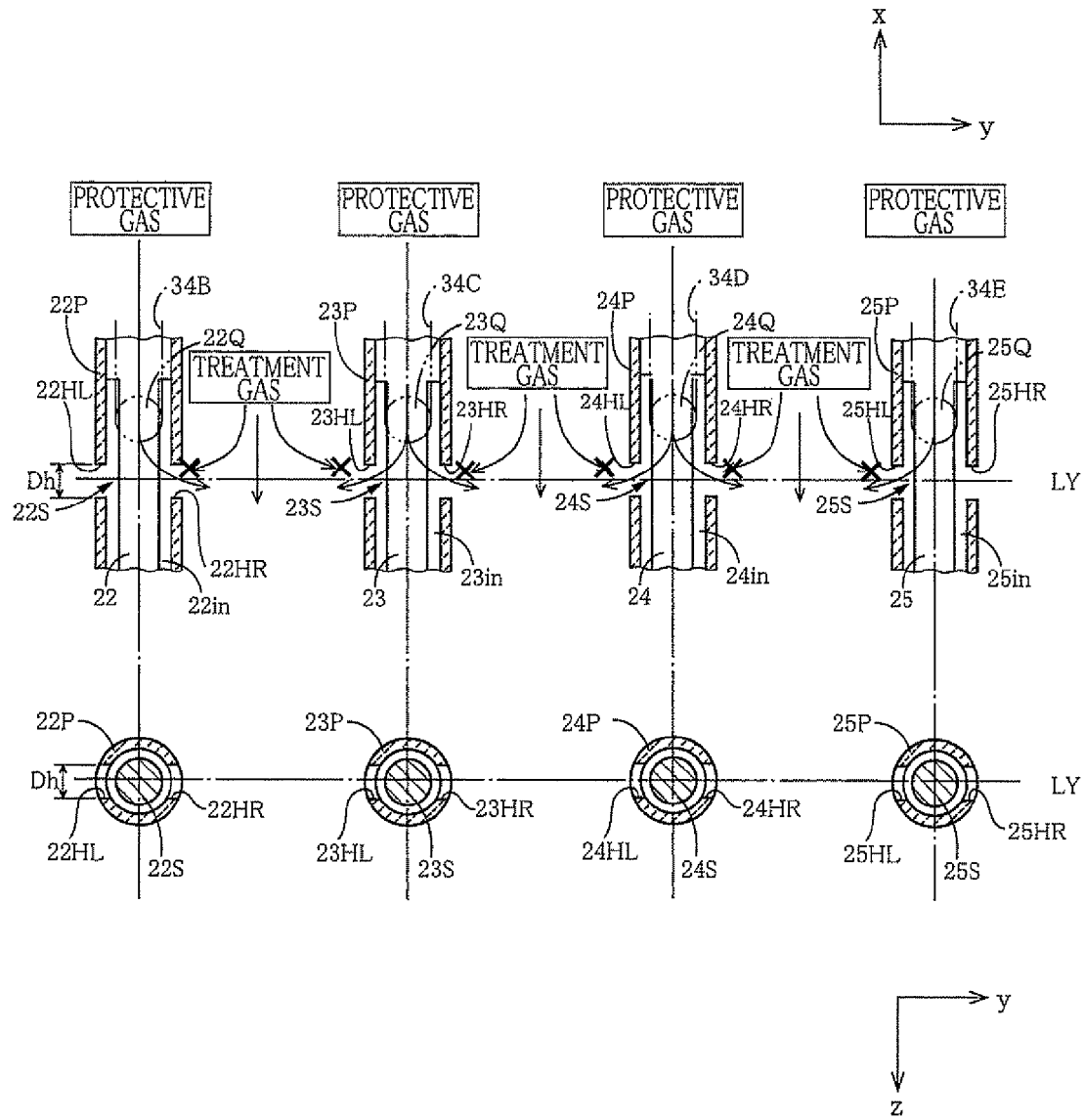
FIG. 7 is a view schematically showing a periphery of each electric-discharge electrode in the above-described radical supply device.

Similarly, as shown in FIGS. 6 and 7, the electrode covers 23P-25P are provided with respective protective-gas inlet ports 23Q-25Q.

As shown in FIGS. 3, 6 and 7, the protective-gas supply passage 34 includes a main passage 34A extending in the Y direction and four individual passages (that may be referred also to as electrode-directed individual passages or electrode-cover-directed individual passages) 34B, 34C, 34D, 34E branched from the main passage 34A. Each of the individual passage 34B, 34C, 34D, 34E has portions extending in the X direction and portions extending in the Z direction, and is connected to a corresponding one of the protective-gas inlet ports 22Q-25Q of the electrode covers 22P-25P.

The main passage 34A of the protective-gas supply passage 34 is connected to a protective-gas supply port 36 that is shown in FIG. 2. As shown in FIG. 1, the protective-gas supply port 36 is connected, via a flow-rate adjusting portion 38, to a protective gas source 40 (which may be a gas cylinder, for example, and which is constituted by an argon gas cylinder in the present embodiment).

The protective gas, which has been supplied from the argon gas cylinder 40 to an inside of the main body 18 of the radical supply device 2 via the flow-rate adjusting portion 38 and protective-gas supply port 36, is supplied to the clearances 22in-25in located inside the electrode covers 22P-25P, via the main passage 34A and individual passage 34B, 34C, 34D, 34E.

As described above, since the treatment gas contains oxygen, there would be a problem that the electrodes are oxidized and worn, for example, if the electrodes were in contact with the treatment gas (i.e., contact with oxygen) upon application of a high voltage thereto. On the other hand, in the arrangement in which the protective gas is supplied of peripheries of the electric-discharge electrode portions 22S-25S, it is possible to cause the electric-discharge electrode portions 22S-25S to be hardly in contact with the treatment gas and to separate gas staying in peripheries of the electric-discharge electrode portions 22S-25S, from the treatment gas, whereby oxidation of the electric-discharge electrode portions 22S-25S can be satisfactorily restrained. Thus, it is possible to restrain each of the electric-discharge electrode portions 22S-25S from being worn, and accordingly to increase the service life.

That is, the protective gas is caused to flow through the protective-gas inlet ports 22Q-25Q to insides of the electrode covers 22P-25P and emitted through the electric-discharge openings 22HR, 23HL, 23HR, 24HL, 24HR, 25HL, while the treatment gas is caused to flow in the electric discharge space in the X direction (i.e., from above to below as seen in FIG. 2), as described below. Therefore, as shown in FIG. 7, the treatment gas is caused to hardly enter insides of the electrode covers 22P-25P through the electric-discharge openings 22HR, 23HL, 23HR, 24HL, 24HR. Consequently, it is possible to separate the gas staying in peripheries of the electric-discharge electrode portions 22S-25S, from the treatment gas. Thus, the electric-discharge openings serve also as protective-gas outlet ports.

It is noted that, among the electric-discharge openings 22HL, 22HR, 25HL, 25HR provided in the electrode covers 22P, 25P that are opposite-end ones of the four electrode covers 22P-25P, the electric-discharge openings 22HL, 25HR (each of which is not opposed to the adjacent electrode) are closed by the main body 18. Therefore, the protective gas supplied to the inside of the electrode cover 22P through the protective-gas inlet port 22Q is caused to flow out through the electric-discharge opening 22HR, and the protective gas supplied to the inside of the electrode cover 25P through the protective-gas inlet port 25Q is caused to flow out through the electric-discharge opening 25HL.

Further, the electrode covers 22P-25P are provided for the respective electrodes 22-25, independently of one another, and the protective gas is supplied to the inside of each one of the electrode covers 22P-25P. Consequently, as compared with an arrangement where the protective gas is supplied commonly to the insides of the plurality of electrode covers via connections among the electrode covers, the protective gas can be more satisfactorily supplied to the respective electric-discharge electrodes 22S-25S.

Further, in each of the electrode covers 22P-25P, a corresponding one of the protective-gas inlet ports 22Q-25Q is offset in phase from a corresponding one of the pairs of electric-discharge openings 22HL, 22HR 25HL, 25HR by 90 degrees. Therefore, the protective gas having flown to the insides of the electrode covers 22P-25P through the protective-gas inlet ports 22Q-25Q can be caused to flow satisfactorily along outer peripheries of the electric-discharge electrode portion 22S-25S. That is, it is possible to cause the protective gas to be supplied over an entire surface of each of the electric-discharge electrode portions 22S-25S, and accordingly to further reliably avoid the entire surface of each of the electric-discharge electrode portions 22S-25S from being in contact with the treatment gas.

Further, in each of the electrode covers 22P-25P, a corresponding one of the clearances 22in-25in is not provided over an entire length of each of the electrode covers 22P-25P, but is provided exclusively in a limited portion located in vicinity of the electric-discharge openings. Therefore, the protective gas can be effectively supplied to a local portion (i.e., a required portion), namely, to a periphery of each of the electric-discharge electrode portion 22S-25S. Further, it is possible to reduce a required amount of the protective gas that is to be supplied, and to satisfactorily restrain oxidation of each of the electric-discharge electrode portions 22S-25S.

In the present embodiment, a protective-gas supplying portion is constituted by at least the protective-gas inlet ports 22Q-25Q, the protective-gas supply passage 34 and the protective-gas supply port 36. The protective-gas supplying portion serves also as a cover-inside protective-gas supplying portion and a corresponding-electrode-directed protective-gas supplying portion.

Further, an electrode protection device is constituted by at least the protective-gas supplying portion and the electrode covers 22P-25P. The electrode protection device may be referred also to as a treatment-gas isolation device, a treatment-gas contact prevention device, an electrode-periphery-gas/treatment-gas separation device or an electrode-oxidation restraint device, for example.

It is noted that the flow-rate adjusting portion 38 and the argon gas cylinder 40 also may be considered as components of the protective-gas supplying portion, i.e., components of the radical supply device 2.

<Supply of Treatment Gas>

The treatment gas is supplied to each of the electric discharge spaces.

Figure 4:
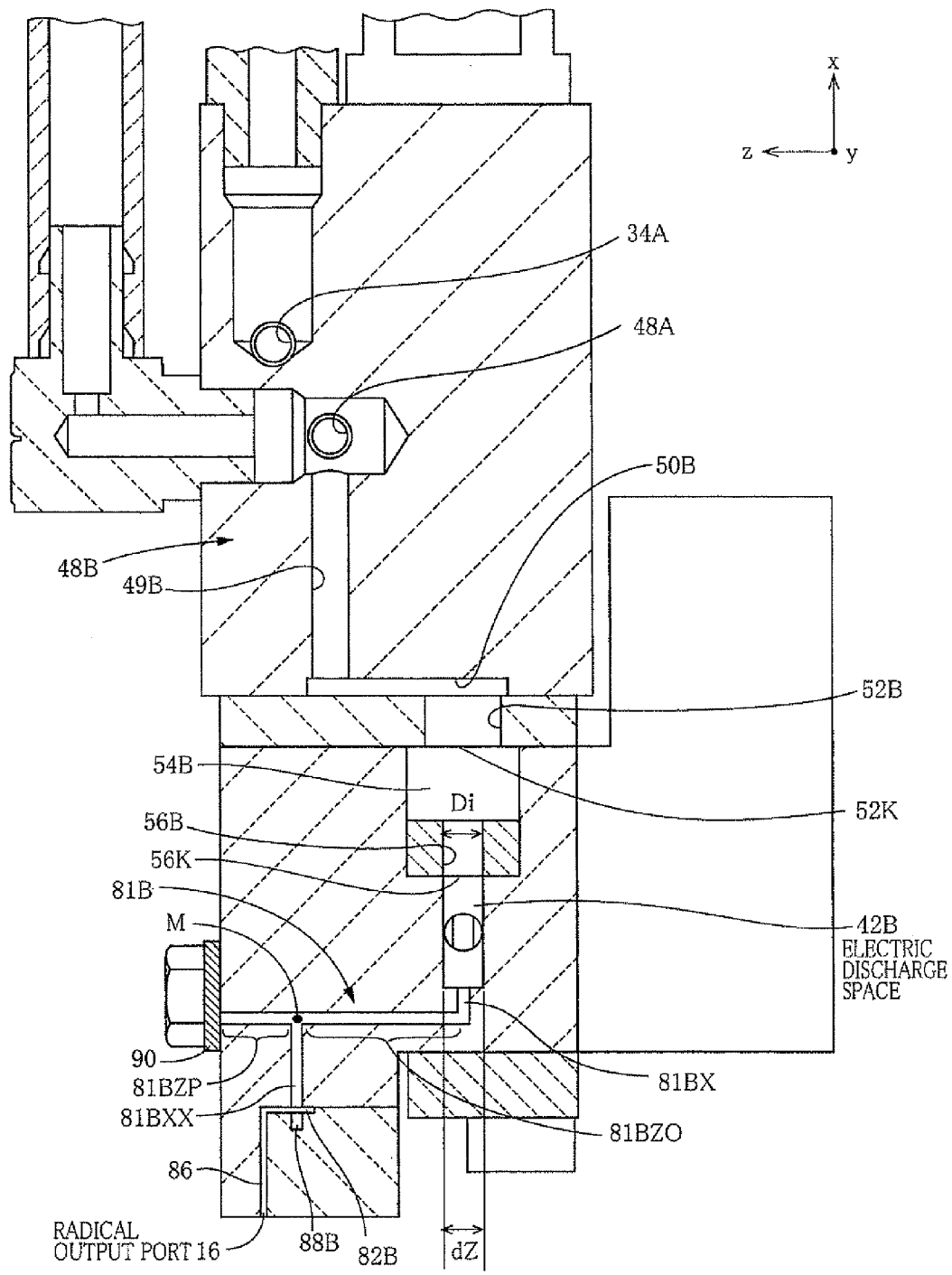
FIG. 4 is a cross sectional view taken along line B-B of FIG. 6.

As shown in FIGS. 4 and 6, each of the electric discharge spaces is a space that is provided between a corresponding one of adjacent pairs of the electric-discharge electrode portions, wherein each adjacent pair of the electric-discharge electrode portions consists of electric-discharge electrode portions that are adjacent to each other. Each of the electric discharge spaces is a space for causing therein an electric discharge (i.e., a breakdown of a gas insulation). In the present embodiment, the electric discharge spaces are surrounded by the main body 18 and the electrode covers 22P-25P, and are constituted by three spaces 42B-42D that are independent from one another. It is noted that the electric-discharge openings provided in the electrode covers 22P-25P are opposed to the electric discharge space 42B-42D.

Described in detail, the electric discharge space 42B is located between the electric-discharge electrode portions 22S, 23S, and is defined by cooperation of the electrode covers 22P, 23P and the main body 18, which cooperate to surround the electric discharge space 42B. The electric-discharge openings 22HR, 23HL are opposed to the electric discharge space 42B. The electric discharge space 42C is located between the electrodes 23, 24, and is defined by cooperation of the electrode covers 23P, 24P and the main body 18, which cooperate to surround the electric discharge space 42C. The electric discharge space 42D is located between the electrodes 24, 25, and is defined by cooperation of the electrode covers 24P, 25P and the main body 18, which cooperate to surround the electric discharge space 42D.

To the treatment-gas supply port 20, the above-described protective gas source (argon gas cylinder) 40 and an oxygen gas source (oxygen gas cylinder) 46 are connected via a flow-rate adjusting portion 44. A treatment-gas supply passage 48, which is connected to the treatment-gas supply port 20, includes a main passage 48A extending in the Y direction and three discharge-space-directed individual passages (individual passage) 48B, 48C, 48D branched from the main passage 48A.

As shown in FIG. 4, the discharge-space-directed individual passage 48B includes an upstream-side passage 49B extending in the X direction, a diffusing portion 50B, an intermediate passage 52B, a space 54B and downstream-side passages 56B, and each of the downstream-side passages 56B has an opening 56K opposed to the electric discharge space 42B. The discharge-space-directed individual passages 48C, 48D have substantially the same construction as the discharge-space-directed individual passage 48B, and the descriptions thereof are omitted.

The upstream-side passage 49B extends in the X direction, and is connected to the diffusing portion 50B that extends in the Y and Z directions. The upstream-side passage 49B is connected to a substantially center, in the Y direction, of the diffusing portion 50B. The intermediate passage 52B, which extends in the X direction, is connected to the diffusing portion 50B at a position that is distant from the upstream-side passage 48 in the Z direction. The intermediate passage 52B has an opening 52K whose opening area is larger than that of an opening of the upstream-side passage 49B. The opening 52K of the intermediate passage 52B is elongated in the Y direction, and is opposed to the space 54B that extends in the Y direction. On a downstream side of the space 54B, there are provided the plurality of downstream-side passages 56B (i.e., five downstream-side passages 56B in the present embodiment) that extend in the X direction. The downstream-side passages 56B are arranged at a constant spacing interval in the Y direction of the electric discharge space 42B.

The treatment gas, which has been supplied through the upstream-side passage 49B in the X direction, is diffused in the Y and Z directions in the diffusing portion 50B and then supplied to the space 54B through the opening 52K that is elongated in the Y direction. Thus, the treatment gas can be supplied to an entirety of the space 54B. Further, the dimension of the space 54B as measured in the Y direction and the dimension of the electric discharge space 42B as measured in the Y direction are substantially the same to each other. The downstream-side passages 56B are arranged evenly over the entire length of the space 54 in the Y direction. Therefore, the treatment gas can be supplied evenly over an entirety of the electric discharge space 42B in the Y direction.

Further, as shown in FIG. 4, a dimension dZ of the electric discharge space 42B as measured in the Z direction is substantially the same as a diameter Dh (see FIG. 7) of each of the electric-discharge openings 22HL, 22HR (dZ=Dh), and a diameter Di of the opening 56K of each of the downstream-side passages 56B is substantially the same as the dimension dZ of the electric discharge space 42B as measured in the Z direction (dZ=Di). Therefore, the treatment gas can be effectively supplied to the entirety of the electric discharge space 42B, so that it is possible to effectively generate a plasma and to effectively generate radicals.

It is noted that, in the present embodiment, the electric discharge space 42B is a generally rectangular parallelepiped shape, and a dimension dY (see FIG. 5) of the electric discharge space 42B as measured in the Y direction is larger than the dimension dZ as measured in the Z direction (dZ<dY). Thus, the dimension dY of the electric discharge space 42B as measured in the Y direction is made relatively large, so that the surface treatment can be performed in a region that is wide in the Y direction while the radical supply device 2 can be made compact in size. Further, a value of dY/dZ may be not smaller than 1.5, not smaller than 2.0, not smaller than 2.5 or not smaller than 3.0.

With application of an electric voltage to the electrodes 22-25, electric discharges (that may be referred also to as plasma electric discharges) are caused between the electrodes 22, 23 (through the electric-discharge openings 22HR, 23HL), between the electrodes 23, 24 (through the electric-discharge openings 23HR, 24HL), and between the electrodes 24, 25 (through the electric-discharge openings 24HR, 25HL), so that an insulation breakdown is caused in each of the electric discharge spaces 42B, 42C, 42D whereby a plasma is generated in each of the electric discharge spaces 42B, 42C, 42D. (In FIG. 5, R23, R34, R45 conceptually indicate respective regions in each of which the insulation breakdown is caused, and each of the regions will be hereinafter referred to as an electric discharge region.)

Further, the treatment gas is supplied to the electric discharge spaces 42B, 42C, 42D in the X direction.

That is, the treatment gas is supplied to pass through the electric discharge regions R23, R34, R45, and the oxygen gas contained in the treatment gas is excited whereby the radicals are formed in the electric discharge regions R23, R34, R45.

In the present embodiment, a treatment-gas supplying portion is constituted by at least the treatment-gas supply passage 48 and the treatment-gas supply port 20. The treatment-gas supplying portion serves also as corresponding-discharge-space-directed gas supplying portions. Further, the flow-rate adjusting portion 44, the argon gas cylinder 40, the oxygen gas cylinder 44 and other elements also may be considered as components of the treatment-gas supplying portion, i.e., components of the radical supply device 2. Further, in the present embodiment, the treatment-gas supplying portion and the protective-gas supplying portion are both provided.

<Output of Radical>

A radical outlet passage 78 as a reactive-species outlet passage is provided between the radical output port 16 and the electric discharge spaces 42B, 42C, 42D.

As shown in FIGS. 4-6 and 8-10, the radical outlet passage 78 includes three individual passage groups 80B, 80C, 80D that are provided for the respective electric discharge spaces 42B, 42C, 42D, three diffusing portions 82B, 82C, 82D that are provided for the respective individual passage groups 80B, 80C, 80D, and a slit passage 86 that is provided commonly for the diffusing portions 82B, 82C, 82D. The radical output port 16 is constituted by an opening of the slit passage 86 which faces the atmosphere.

The individual passage group 80B (that is described as a representative of the three individual passage groups 80B, 80C, 80D, and the individual passage groups 80C, 80D have substantially the same construction as the individual passage group 80B, so that the descriptions thereof are omitted.) includes a plurality of individual passages 81B (i.e., eight individual passage 81B in the present embodiment) each having an opening 81K that is opposed to the electric discharge space 42B.

Each of the individual passages 81B has a bent shape (i.e., curved shape), and includes (a) an X portion 81BX located below the electric discharge space 42B and extending in the X direction, (b) a Z portion 81BZ connected to the X portion 81BX and extending in the Z direction, and (c) another X portion 81BXX connected to a midway of the Z portion 81BZ and extending in the X direction. The X portions 81BXX of the respective individual passages SIB are connected to the diffusing portion 82B.

{Regarding Diffusing Portion}

Figure 8:
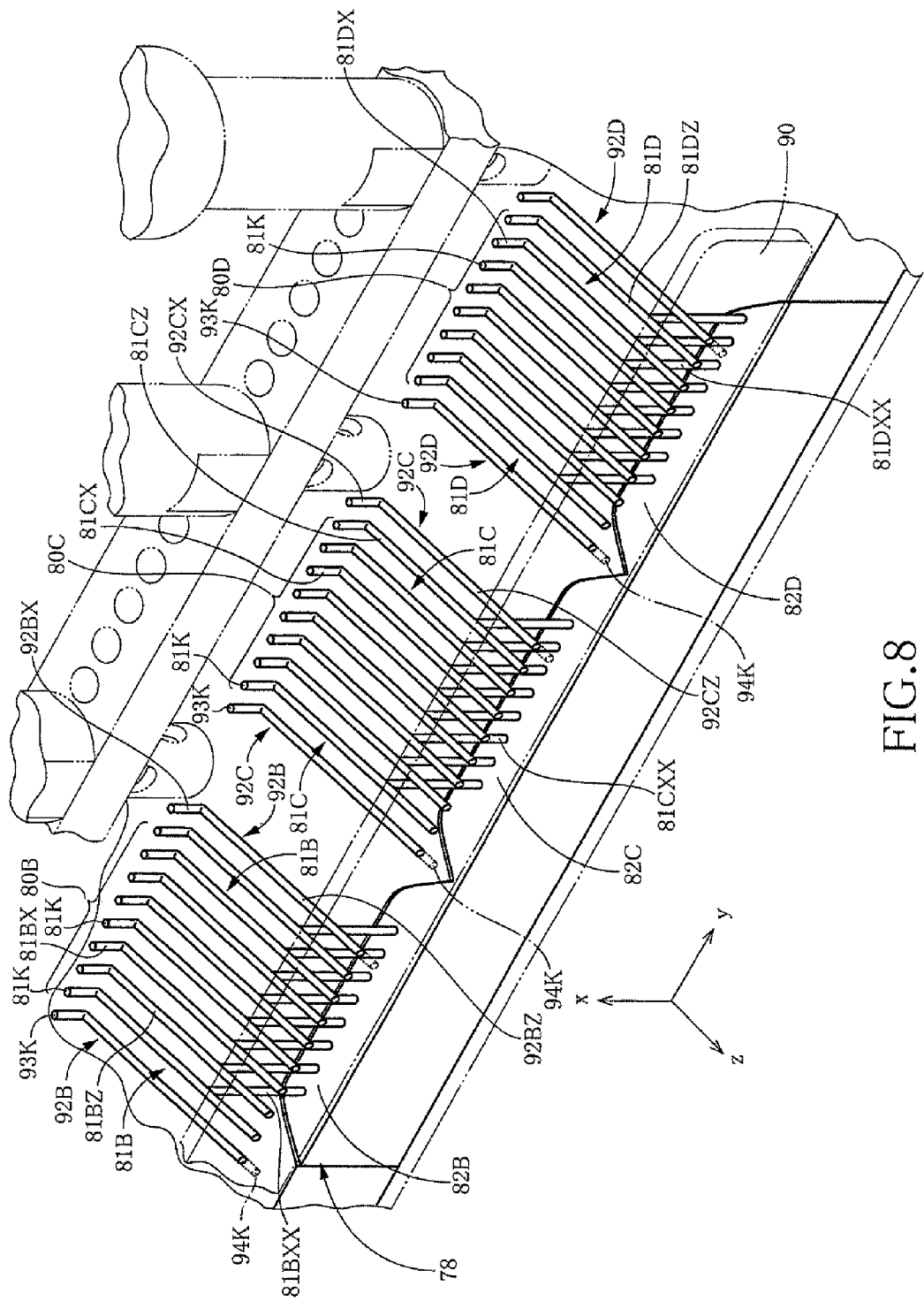
FIG. 8 is a perspective view schematically showing a periphery of a radical outlet passage in the radical supply device. Although the radical outlet passage is formed in a main body of the above-described radical supply device so as to be actually invisible, the radial outlet passage is represented by solid line while the main body is represented by two-dot chain line in FIG. 8.

The diffusing portion 82B has a shape extending in the Y and Z directions as shown in FIG. 8. The slit passage 86 and the plurality of X portions 81BXX, which are distant from the slit passage 86 in the Z direction are connected in the diffusing portion 82B, as shown in, for example, FIG. 9.

Further, the diffusing portion 82B has an inner space having a trapezoidal shape as seen in its plan view, such that the trapezoidal-shaped inner space of the diffusing portion 82B has a long side and a short side. The diffusing portion 82B is connected, at its portion close to the long side, to the slit passage 86, and is connected, at its portion close to the short side, to the plurality of individual passages 81B. The plurality of individual passages 81B, which are connected to the portion close to the short side, are arranged over an entirety of the portion close to the short side, at a given spacing interval in the Y direction. Inner side walls defining respective oblique sides of the trapezoidal-shaped inner space of the diffusing portion 82B are inclined such that a distance between the inner walls in the Y direction is increased as viewed in a direction away from the individual passage group 80B toward the slit passage 86.

The individual passages 81B-81D are not provided in portions in which the electrodes 22-25 are provided. The slit passage 86 extends continuously in the Y direction, and has the slit-like-shaped opening 16. For enabling a gas containing radicals to be outputted evenly from an entirety of the slit passage 86, the gas containing radicals has to be distributed over an entire length of each of the diffusing portions 82B-82D in the Y direction, namely, has to be supplied to also portions of the diffusing portions 82B-82D in which the individual passages 81B-81D are not connected. To this end, the slit-passage side of each of the diffusing portions 82B-82D is adapted to extend to positions aligned with corresponding two of the electrodes 22-25 in the Y direction, so that the gas containing radicals can be supplied also to the portions of the diffusing portions 82B-82D in which the individual passages 81B-81D are not provided.

Further, the diffusing portions 82B, 82C, 82D are connected at their slit-passage sides to one another. In other words, the diffusing portions 82B, 82C, 82D have respective portions that are held in communication with one another in the Y direction. Owing to this arrangement, too, the gas containing radicals can be outputted evenly from the entire length of the slit passage 86 in the Y direction.

It is noted that a shape of each of the diffusing portions 82B, 82C, 82D as seen in its plan view (i.e., a shape of a space defined by an inner circumferential wall of each of the diffusing portions 82B, 82C, 82D) does not necessarily have to be trapezoidal but may be generally rectangular. The same advantageous effect can be obtained not only where the shape of the space of each diffusing portion is trapezoidal but also where the shape of the space of each diffusing portion is rectangular.

Figure 9:
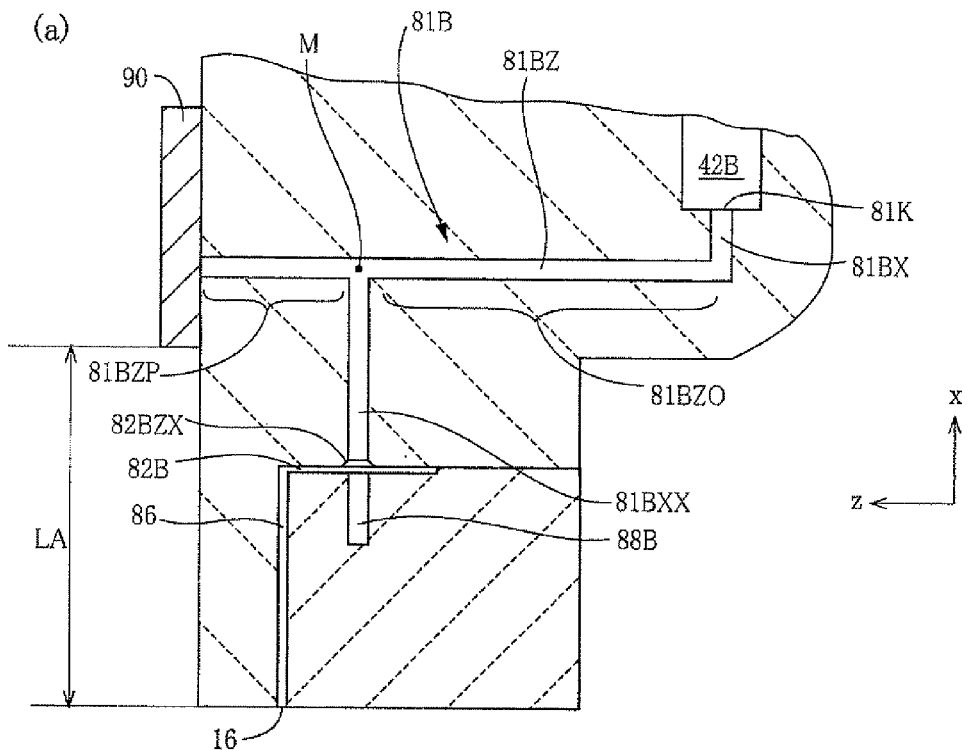
FIG. 9 is a set of views wherein (a) is a view showing a part of FIG. 4 and (b) is a cross sectional view taken along line D-D of FIG. 6.
Figure 9:
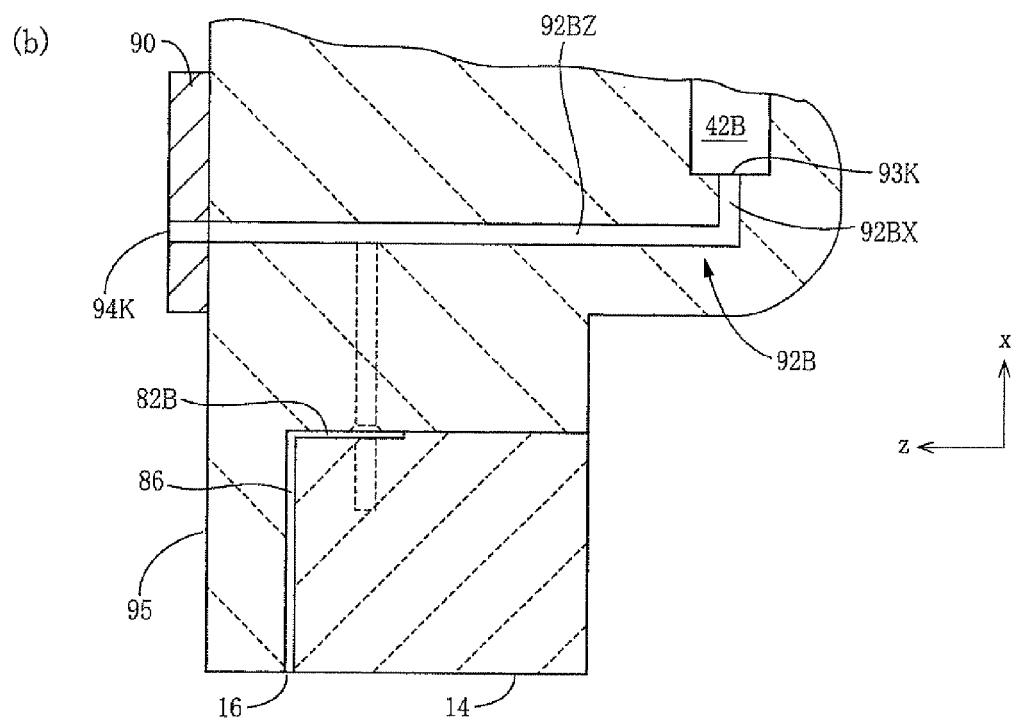
Figure 10:
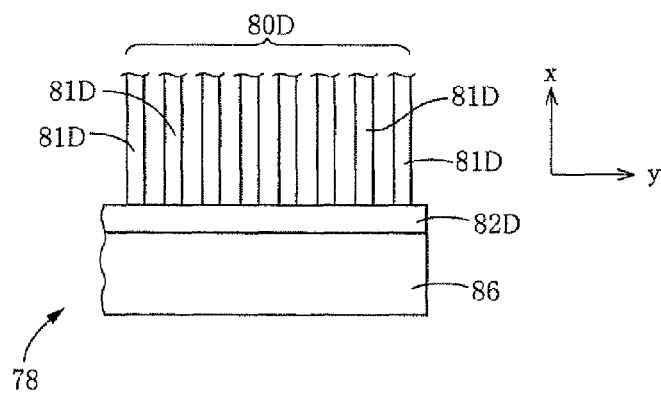
FIG. 10 is a view schematically showing the radical outlet passage in the above-described radical supply device.

The inner space of the diffusing portion 82B has a length (i.e., thickness), as measured in the X direction, which is smaller than an inside diameter of each individual passage 81B. Further, as shown in FIG. 9, the X portion 81BXX is connected at its connection portion 82BZX to the diffusing portion 82B, wherein an inside diameter of the connection portion 82BZX is gradually increased.

If the inside diameter of the connection portion 82BZX of the X portion 81BXX were constant, there would be problems such as generation of a turbulent flow of the gas (that contains radicals or the like) as a result of change of flow rate of the gas, which could be caused when the gas is supplied from the X portion 81BXX to the diffusing portion 82B.

On the other hand, in the above-described arrangement in which the connection portion 82BZX is shaped such that the inside diameter is gradually increased, it is possible to restrain change of the flow rate of the gas (that contains radicals or the like) supplied through the X portion 81BXX and accordingly to cause the turbulent flow to be hardly generated, whereby the gas (that contains radicals or the like) can be satisfactorily diffused within the diffusing portion 82B.

{Regarding Slit}

The radical output port 16 of the radical outlet passage 78 is adapted to have a slit-like shape. That is, the slit passage 86 is connected to the diffusing portion 82B, so that the surface treatment can be performed evenly over a continuous region of the treatment surface WF of the workpiece W which is continuous in the Y direction.

{Regarding Pocket}

A recessed portion (hereinafter referred to as a pocket) 88B is provided in a portion of each of the individual passages 81B which extends in the X direction. The pocket 88B further extends in a downward direction (i.e., in the X direction). In the present embodiment, a total of eight pockets 88B are provided in respective positions which are located in a bottom of the diffusing portion 82B and which correspond to the respective connection portions 82BZX of the X portions 81BXX.

As described below, each pocket 88B is provided for receiving therein dust flowing in the radical outlet passage 78. Since a gas containing dust has a specific gravity larger than that of the gas containing radicals or the like, the gas containing dust is likely to be moved downwardly. Therefore, it is effective that the pocket as a dust receiving portion is shaped to protrude downwardly.

The dust is in a gaseous state under a high temperature, and it is considered that the dust is brought back into a solid state when the temperature is then lowered. In any case, the gas containing the dust or the dust per se has a large specific gravity, so as to be moved downwardly in the radical outlet passage 78.

Further, the pocket 88B is connected to a downwardly extending passage (i.e., the X portion 81BXX in the present embodiment), and extends further downwardly. The gas containing radicals or the like is caused to flow vigorously in the downward direction, so that the pocket 88B can reliably receive the dust therein.

Owing to provision of the pocket 88B, it is possible to cause the dust to be hardly outputted through the radical output port 16 of the slit passage 86, and accordingly to cause the dust to be hardly supplied to the workpiece W.

It is noted that the pocket does not have to be provided necessarily in the portion extending in the X direction but may be provided in a portion of each individual passage which extends in the Z direction. That is, the pocket may be provided in any portion of each individual passage. Further, two or more pockets may be provided in each individual passage.

{Regarding Earth Ground Plate}

The radical outlet passage 78 is provided with an earth ground plate 90. In the present embodiment, as shown in FIG. 8, the earth ground plate 90 is provided to close distal ends of the Z portions 81BZ-81DZ of all the individual passages 81B-81D. The earth ground plate 90 functions as a lightning conductor, for making an electric discharge hardly caused between the workpiece W and any one of the electrodes. Further, the earth ground plate 90 functions to make a charged substance (e.g., charged gas) be hardly supplied to the workpiece W, or to avoid supply of the charged substance to the workpiece W.

In the present embodiment, as shown in FIGS. 4 and 9 (*a*), a main passage of the individual passage 81B is constituted by, for example, the X portion 81BX, a discharge-space side portion 81BZO of the Z portion 81BZ, the X portion 81BXX, the diffusing portion 82B and the slit passage 86, wherein the discharge-space side portion 81BZO is located on an electric-discharge-space side of a connection portion M of the Z portion 81BZ at which the Z portion 81BZ is connected to the X portion 81BXX. Meanwhile, a branch passage of the individual passage 81B is constituted by a remote portion 81BZP of the Z portion 81BZ which is located on a side of the connection portion M which is remote from the electric discharge space. Since the branch passage 81BZP and the discharge-space side portion 81BZO (that constitutes a part of the main passage) extend along the same straight line, the earth ground plate 90 closes the branch passage 81BZP that extends along the same straight line along which the discharge-space side portion 81BZO as the part of the main passage extends.

It is possible to consider that each of the individual passages 81B-81D includes the main passage and the branch passage. Further, it is also possible to consider that the individual passages 81B-81D include the main passage and the branch passage which are common to all of the individual passages 81B-81D.

The electric discharge is caused between each pair of electrodes which are adjacent to each other (e.g., between the electrodes 22, 23). When the electric discharge is caused, electrons are easily movable so that it is considered that the plasma is in a gaseous state. If the plasma in the gaseous state (hereinafter referred to as gas containing plasma, which contains radicals, positive and negative ions and electrons) enters into the individual passage 81B, there is a risk that an electric discharge is caused between the between the workpiece W and at least one of the electrodes.

Further, each electron has a characteristic that it is likely to move linearly.

Moreover, the X portion 81BXX is bent with respect to the Z portion 81BZ, and the distal end of the Z portion 81BZ is closed by the earth ground plate 90. The electrons contained in the plasma move toward the earth ground plate 90, so that the electric discharge is caused between the earth ground plate 90 and at least one of the electrodes, and it is possible to make the electric discharge hardly caused between the workpiece W and any one of the electrodes.

Meanwhile, the X portion 81BXX is open (i.e., not closed), so that the gas is caused to easily move toward the X portion 81BXX. Consequently, the electric discharge is caused between the earth ground plate 90 and at least one of the electrodes, and it is possible to make the electric discharge hardly caused between the workpiece W and any one of the electrodes, and to supply the gas containing radicals or the like to the workpiece W.

When the gas containing plasma is charged positively or negatively, electrons are transferred between the gas and the earth ground plate 90 by contact of the gas with the earth ground plate 90, whereby the charged particles are placed at the same electrical potential as the earth ground plate 90, so as to become electrically neutral.

Consequently, it is possible to make the charged gas hardly supplied to the workpiece W and to make the workpiece W hardly charged.

If the earth ground plate 90 were disposed in a midway of the main passage so as to be contactable with the gas containing plasma which flows in the main, passage, the earth ground plate 90 would be in contact with the charged particles contained in the plasma, thereby causing a reaction between the earth ground plate 90 and the charged particles and causing problems such as reduction of the service life of the earth ground plate 90.

On the other hand, in the present embodiment, the earth ground plate 90 is provided to close the branch passage that is connected to the main passage, (for causing the radicals to be hardly flow to the branch passage,) so that it is possible to separate a direction of movement of the electrons and a direction of flow of the gas containing the radicals or the like, from each other, and accordingly to separate the electrons and the gas, whereby the reduction of the service life of the earth ground plate 90 can be avoided and the surface treatment can be efficiently carried out. In other words, it is possible to reduce damage of the earth ground plate 90 and to efficiently carry out the surface treatment.

If the earth ground plate 90 were disposed in a position close to the workpiece W, an electricity could be easily discharged from the earth ground plate 90 toward the workpiece W. For preventing the electric discharge between the earth ground plate 90 and the workpiece W, it might be possible to sufficiently increase a distance between the earth ground plate 90 and the radical output port 16, namely, a distance (i.e., shortest distance) LA between the earth ground plate 90 and the lower surface 14. However, the increase of the distance LA leads to an increase of length of the radical outlet passage 78, thereby making it difficult to effectively supply the radicals to the treatment surface WF of the workpiece W.

In the present embodiment, the distance LA, which does not cause the electric discharge between the earth ground plate 90 and the workpiece W, is predetermined by experiments, simulations or the like, and the earth ground plate 90 is disposed in a position that is defined by the predetermined distance LA. The experiments or simulations are carried out by making a distance between the radical output port 16 and the workpiece W extremely small. The probability of occurrence of the electric discharge between the earth ground member 90 and the workpiece W is dependent on, mainly, a material (conductivity) of the workpiece W, for example.

{Regarding Opening of Individual Passage Opposed to Electric Discharge Space}

An area So of the opening 81K of each individual passage 81B opposed to the electric discharge space 42B is smaller than an area Si of the opening 56K of each downstream-side passage 56B of the treatment-gas supply passage 48 (So<Si), and the opening 81K is located in an intermediate portion, as viewed in the Z direction, of the electric discharge space 42B. Consequently, the radicals or the like formed in the electric discharge space 42B can be satisfactorily collected.

Further, the area So of the opening 81K of each individual passage 81B is smaller than the electric discharge space 42B. In other words, a diameter of the opening 81K is made small. In the present embodiment, the diameter of the opening 81K is not larger than 2 mm.

If the opening 81K has a large size as measured in the Y direction, an electric discharge could be easily caused between the workpiece W and at least one of the electrodes.

On the other hand, in the arrangement in which the diameter of the opening 81K is not larger than 2 mm, it is possible to make an electric discharge hardly caused between the workpiece W and any one of the electrodes, even if an abnormal electric discharged were caused. The diameter of the opening 81K may be not larger than 1.8 mm, not larger than 2.5 mm, not larger than 3.0 mm or not larger than 3.5 mm.

Further, a sum $\Sigma$So of the areas of the openings 81K of the respective eight individual passages 81B is made smaller than a sum $\Sigma$Si of the areas of the openings 56K of the respective five downstream-side passages 56B ($\Sigma$Si>$\Sigma$So). Meanwhile, a sum (Qin+Qhin) of a flow rate Qin of the treatment gas supplied to the three electric discharge spaces 42B, 42C, 42D and a flow rate Qhin of the protective gas supplied to the four electrode covers 22P-25P is, in principle, equal to a sum Qout of flow rates of the gas containing radicals or the like and the protective gas flowing out through the radical outlet passage 78 and a protective-gas exhaust passage that is described below {(Qin+Qhin)=Qout}. Consequently, a flow velocity Vout of the gas containing radicals or the like caused to flow out through the radical output port 16 of the radical outlet passage 78 is higher than a flow velocity Vin of the treatment gas supplied to the electric discharge spaces (Vin<Vout), so that the gas containing radicals or the like can be irradiated onto the workpiece W at a high flow velocity.

It is preferable that the radical output port 16 has a slit-like shape.

It might be possible to employ an arrangement in which the entirety of the radical outlet passage 78, which is located on a downstream side of the electric discharge space 42B, has a cross section that is elongated in the width direction.

However, in such an arrangement, an electric discharge could be easily caused between the workpiece W and at least one of the electrodes, as described above.

On the other hand, in the above-described arrangement in which the opening 81K opposed to the electric discharge space 42B has a small diameter while the opening 16 opposed to the treatment surface WF of the workpiece W has a slit-like shape, both of the objects can be achieved.

Further, if the plurality of individual passages 81B were connected directly to the slit passage, it would be difficult to cause the radicals to be outputted evenly through the opening of the slit-like shape.

On the other hand, in the above-described arrangement in which the diffusing portion 82B is provided between the plurality of individual passages 81B and the slit passage 86, it is possible to cause the electric discharge to hardly enter the radical outlet passage 78 and to cause the radicals to be supplied to the workpiece W evenly through the radical output port 16 having the slit-like shape.

It is noted that, owing to the small diameter of the opening 81K, there is an effect that the dust is caused to hardly enter each individual passage 81B.

{Regarding Curvature of Radical Outlet Passage}

In the present embodiment, the radical outlet passage 78 is curved in its midway.

If the radical outlet passage 78 were a straight line, namely, if the radical outlet passage 78 were shaped to extend straight from the opening 81K (that is opposed to the electric discharge space 42B) to the radical output port 16, an electric discharge would be easily caused between the workpiece W and at least one of the electrodes, upon flow of the gas containing plasma, into the radical outlet passage 78. Thus, this straight arrangement is not preferable. Further, there is a case where an ultraviolet ray generated as a result of the electric discharge is irradiated onto the treatment surface WF of the workpiece W, thereby causing a risk of damage of the workpiece W. It is presumed that the ultraviolet ray is emitted by excited atoms (that have been excited by energy applied thereto) when the excited atoms are brought back into ground states.

On the other hand, in the arrangement in which the radical outlet passage 78 is curved, an electric discharge is hardly caused between the workpiece W and any one of the electrodes, so that it is possible to obtain an effect that the ultraviolet ray is hardly irradiated.

<Protective-Gas Exhaust Passage>

On a downstream side of the electric discharge space 42B, two protective-gas exhaust passages 92B are provided. On a downstream side of the electric discharge space 42C, two protective-gas exhaust passages 92C are provided. On a downstream side of the electric discharge space 42D, two protective-gas exhaust passages 92D are provided.

As shown in FIG. 9 (b), each of the protective-gas exhaust passages 92B has an opening 93K that is opposed to the electric discharge space 42B, and includes an X portion 92BX extending in the X direction and a Z portion 92BZ extending in the Z direction. The X portion 92BX is adjacent to the X portion 81BX of the individual passage 81B, and is parallel to the X portion 81BX of the individual passage 81B. The Z portion 92BZ is adjacent to the Z portion 81BZ of the individual passage 81B, and is parallel to the Z portion 81BZ of the individual passage 81B. The protective-gas exhaust passages 92C, 92D have substantially the same construction as the protective-gas exhaust passages 92B, and the descriptions thereof are omitted.

The opening 93K of one of the two protective-gas exhaust passages 92B is located in a position adjacent to the electric-discharge opening 22HR of the electrode cover 22P. The opening 93K of the other of the two protective-gas exhaust passages 92B is located in a position adjacent to the electric-discharge opening 23HL of the electrode cover 23P. Further, the Z portion 92BZ of each of the protective-gas exhaust passages 92B has a distal end which penetrates through the earth ground plate 90 and which serves as an exhaust port 94K. The exhaust port 94K is located in a position distant from the radical output port 16. In the present embodiment, the exhaust port 94K is provided in a front surface 95 of the main body 18 of the radical supply device 2, while the radical output port 16 is provided in the lower surface 14 as a surface of the main body 18 which is other than the front surface 95. Consequently, it is possible to cause the protective gas exhausted through the exhaust port 94K, to be hardly mixed with the radicals outputted through the radical output port 16.

It is noted that, in the present embodiment, a main body cover, which is not shown in the drawings, is attached to an outside of the main body 18 of the radical supply device 2, so that it is possible to prevent the protective gas (containing dust) exhausted through the exhaust port 94K, from being supplied to the treatment surface WF of the workpiece W.

On a downstream side of the electric discharge space 42B, a total of ten individual outlet passages are arranged in a row extending in the Y direction. The ten individual outlet passages consist of the eight individual passages 81B that belong to the individual passage group 80B and the two protective-gas exhaust passages 92B. Among the ten individual outlet passages, opposite-end ones of them (i.e., two located in respective opposite ends of the row) are the protective-gas exhaust passages 92B having the respective openings 93K located in respective positions which are the closest to the electric-discharge openings 22HR, 23HL, respectively. Among the ten individual outlet passages, intermediate ones of them are the eight individual passages 81B constituting the radical outlet passage 78 and having the openings 81K that are located in an intermediate portion, as viewed in the Y direction, of the electric discharge space 42B.

As described above, the protective gas, which has been caused to flow into the insides of the electrode covers 22P-25P, is then caused to flow out through the electric-discharge openings 22HR, 23HL, 23HR, 24HL, 24HR, 25HL. In this instance, the dust, together with the protective gas, is caused to flow out through the electric-discharge openings 22HR, 23HL, 23HR, 24HL, 24HR, 25HL.

However, it is not preferable that the dust is supplied, together with the radicals, to the treatment surface WF of the workpiece W.

It is considered that the dust is hardly caused to scatter by a large distance, because the dust per se or a gas containing the dust has a specific gravity larger than that of a gas containing the radicals or the like In view of this, the protective-gas exhaust passages 92B-92D are constituted by passages having respective openings located in respective positions which are the closest to the electric-discharge openings 22HR, 23HL, 23HR, 24HL, 24HR, 25HL, so that the gas (that contains the dust) flowing in the protective-gas exhaust passages 92B-92D are avoided from being outputted through the radical output port 16. In this sense, the protective-gas exhaust passages 92B-92D may be referred also to as dummy passages.

It is noted that each of the electric discharge spaces 42B, 42C, 42D is provided between a corresponding adjacent pair of the electrodes 22-25 so that the electric discharge space is not provided on a side of the electrode 22 which is remote from the electrode 23 and on a side of the electrode 25 which is remote from the electrode 24. In the present embodiment, the electric-discharge openings 22HL, 25HR are closed by the main body 18 so that the protective-gas exhaust passage is not provided in positions adjacent to the electric-discharge openings 22HL, 25HR.

Further, the openings 81K, 93K of the individual outlet passages 81B, 92B may be referred to as discharge-space-side openings.

If the protective gas and the gas containing the radicals or the like are caused to flow together with each other, a density of the radicals (i.e., density of the radicals contained in the gas outputted from the radical output port 16) is reduced, thereby causing a problem that the surface treatment cannot be efficiently carried out.

On the other hand, in the arrangement in which the protective gas is exhausted whereby the protective gas is hardly caused to flow together with the gas (that contains the radicals or the like) flowing in the radical outlet passage 78, it is possible to restrain reduction of the density of the radicals and to improve efficiency of the surface treatment.

It is noted that, in the present embodiment, all of the protective gas is not necessarily exhausted, but at least a part of the protective gas is exhausted, so that the reduction of the density of the radicals can be restrained as compared with an arrangement in which the protective gas is not exhausted.

However, since the protective gas serves as a carrier gas of the treatment gas, it is not problematic even if the gas containing the radicals or the like and the protective gas are caused to flow together with each other.

Further, since the exhaust ports 94K are provided in the earth ground plate 90, an electric discharge advancing in each of the protective-gas exhaust passages 92B-92D is caused between the earth ground plate 90 and at least one of the electrodes, whereby an electric discharge can be made to be hardly caused between the workpiece W and any one of the electrodes.

<Control Device>

The present surface treatment apparatus is provided with a control device 100 that is constituted mainly by a computer. To the control device 100, there are connected the above-described flow-rate adjusting portions 38, 44 and voltage adjustor device 30, so that the flow rates of the protective gas and the treatment gas and the electric voltages applied to the electrodes 22-25 are controlled to respective target values in accordance with programs stored in the computer.

The protective gas and the treatment gas are supplied at least during the electric discharge. For example, the supplies of the protective gas and the treatment gas may be started upon application of the electric voltages.

In the surface treatment apparatus according to the present embodiment, a distance between each adjacent two of the electrodes is 20 mm, and an effective alternating current voltage of 12 KV is applied to the electrodes. Between each adjacent two of the electrodes 22-25, an electric discharge (that may be referred also to as a plasma electric discharge) is caused, whereby electric discharge regions R23, R34, R45 are formed.

The treatment gas is supplied at a rate of 1.8 liters per minute, while the protective gas is supplied at a rate of 0.6 liters per minute. The treatment gas contains an oxygen gas and an argon gas, and the density of the oxygen gas is about 1%.

The treatment gas is supplied to the electric discharge spaces 42B-42D, and the radicals or the like formed in the plasma are supplied, through the radical outlet passage 78 and the radical output port 16 having the slit-like shape, onto the treatment surface WF of the workpiece W, whereby a treatment is performed on the treatment surface WF of the workpiece W.

Further, since the protective gas is supplied to peripheries of the respective electric-discharge electrode portions 22S-25S, an atmosphere surrounding each of the electric-discharge electrode portions 22S-25S can be separated from the treatment gas. Consequently, it is possible to restrain oxidation of the electric-discharge electrode portions 22S-25S, and to increase the service life. Further, since the flow rate of the treatment gas is made higher than the flow rate of the protective gas, it is possible to more reliably cause the treatment gas to be hardly brought into contact with the electric-discharge electrode portions 22S-25S.

Moreover, since the earth ground plate 90 is provided in the radical outlet passage 78, it is possible to make the electric discharge hardly caused between the workpiece W and any one of the electrodes. Further, it is possible to cause the charged gas to be hardly supplied to the workpiece W.

Particularly, where the workpiece W is an electronic component (substrate), it is not preferable that the workpiece W is charged by supply of a charged gas to the workpiece W. On the other hand, in the present surface treatment apparatus, the supply of a charged gas to the workpiece W is avoided, so that an electrification of the workpiece W can be prevented where the workpiece W is an electronic component.

The kind of treatment gas and the kind of protective gas are not limited to details in the above-described embodiment, and may be selected suitably depending on a material of the workpiece W, a purpose of the treatment and other factors. A hydrogen gas may be used as the reaction gas. Further, a nitrogen gas, a fluorine gas or the like may be used as the protective gas. It is not essential that the protective gas is argon as the carrier gas contained in the treatment gas. That is, the protective gas may be a kind of gas that is not contained in the treatment gas.

Further, the area Sa of the opening 93K of each of the protective-gas exhaust passages 92B-92D may be made larger than the area So of the opening 81K of each of the individual passage 81B-81D (Sa>So). By this arrangement, the protective gas and the dust can be exhausted to an exterior of the radical supply device 2 through the protective-gas exhaust passages 92B-92D.

Embodiment 2

Figure 11:
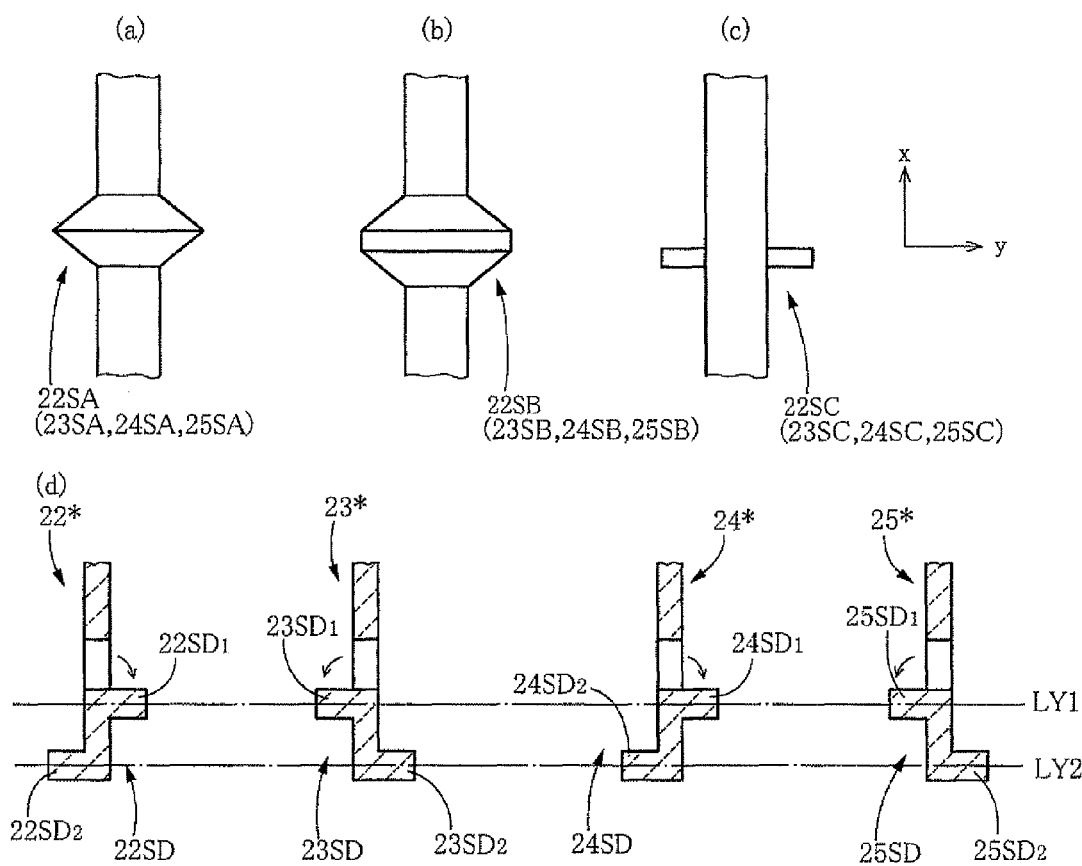
FIG. 11 is a set of views showing other forms of the electrode which can be employed in the above-described radical supply device (Embodiment 2).

In the above-described embodiment, each of the electric-discharge electrode portions 22S-25S of the respective electrodes 22-25 is a cylindrical-shaped portion having a diameter that is constant in the axial direction (i.e., X direction). However, as shown in FIG. 11, each of the electric-discharge electrode portions may be shaped to include a protrusion portion that protrudes in a radial direction. As compared with the arrangement in which each electric-discharge electrode portion has the cylindrical shape, a non-uniform electric field can be easily formed and an electric discharge can be easily caused. Regarding the other portions of the surface treatment apparatus, the present embodiment is substantially the same as the above-described embodiment, so that the descriptions of the other portions are omitted.

For example, as shown in FIG. 11 (a), an electric-discharge electrode portion 22SA may be a disc-like-shaped portion whose radius is gradually increased and then gradually reduced as viewed in the X direction, namely, whose radius is maximized at its intermediate portion. It is noted that electric-discharge electrode portions 23SA, 24SA, 25SA may be identical in shape with the electric-discharge electrode portion 22SA.

Further, as shown in FIG. 11 (b), an electric-discharge electrode portion 22SB may be a disc-like-shaped portion whose radius is gradually increased, then made constant at its maximum value and then gradually reduced, namely, in which a radially maximized portion extends in the axial direction. It is noted that electric-discharge electrode portions 23SB, 24SB, 25SB may be identical in shape with the electric-discharge electrode portion 22SB.

Still further, as shown in FIG. 11 (c), an electric-discharge electrode portion 22SC may include a bar-like-shaped protrusion portion that protrudes in the radial direction. It is noted that electric-discharge electrode portions 23SC, 24SC, 25SC may be identical in shape with the electric-discharge electrode portion 22SC.

Further, as shown in FIG. 11 (d), each of electrodes 22*-25* may be a generally plate-like-shape member, and each of electric-discharge electrode portions 22SD, 23SD, 24SD, 25SD may be a bent-shaped portion that is formed by notching and bending an end portion or a part of the plate-like-shape member.

The electric-discharge electrode portions 22SD-25SD have respective pairs of pawl portions $22SD_1$, $22SD_2$-$25SD_1$, $25SD_2$. Each pair of pawl portions consist of two pawl portions that are bent in respective directions opposite to each other. As shown in FIG. 11 (d), one $22SD_1$ of the pawl portions $22SD_1$, $22D_2$ of the electric-discharge electrode portion 22SD and one $23SD_1$ of the pawl portions $23SD_1$, $23SD_2$ of the electric-discharge electrode portion 23SD are opposed to each other, one $24SD_1$ of the pawl portions $24SD_1$, $24D_2$ of the electric-discharge electrode portion 24SD and one $25SD_1$ of the pawl portions $25SD_1$, $25SD_2$ of the electric-discharge electrode portion 25SD are opposed to each other, and the other $23SD_2$ of the pawl portions $23SD_1$, $23D_2$ of the electric-discharge electrode portion 23SD and the other $24SD_2$ of the pawl portions $24SD_1$, $24SD_2$ of the electric-discharge electrode portion 24SD are opposed to each other.

Further, in each of the electrodes 22*-25*, a corresponding one of pairs of pawl portions $22SD_1$, $22SD_2$-$25SD_1$, $25SD_2$ consist of two pawl portions located in respective positions that are offset from in the X direction. Therefore, as shown in FIG. 11 (d), the pawl portions $22SD_1$, $22SD_2$-$25SD_1$, $25SD_2$ of the electric-discharge electrode portions 22SD, 23SD, 24SD, 25SD are arranged in two rows. The electric-discharge electrode portions 22SD, 23SD, 24SD, 25SD are positioned relative to one another such that the pawl portion $22SD_1$, $23SD_1$, $24SD_1$, $25SD_1$ lie on a straight line LY1, while the pawl portion $22SD_2$, $23SD_2$, $24SD_2$, $25SD_2$ lie on a straight line LY2. In the present embodiment, an electric discharge is caused on the straight line LY1 between the pawl portions $22SD_1$ and $23SD_1$ and between the pawl portions $24D_1$ and $25SD_1$, while an electric discharge is caused on the straight line LY2 between the pawl portions $23SD_2$ and $24SD_2$.

Embodiment 3

It is noted that a shape of the radical outlet passage and a position or the like of attachment of the earth ground plate are not limited to the details of the above-described embodiments.

Figure 12:
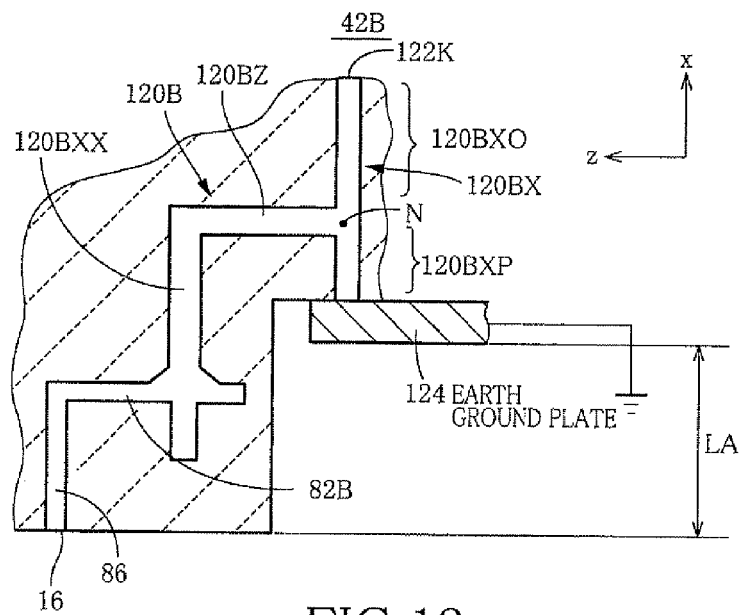
FIG. 12 is a view schematically showing a periphery of another radical outlet passage that is applicable to the above-described radical supply device (Embodiment 3).

FIG. 12 shows an example of the radical outlet passage and the earth ground plate. Since the other portions of the surface treatment apparatus are the same as those of the above-described embodiments, the descriptions thereof are omitted.

Each individual passage 120B includes (a) an X portion 120BX extending in the X direction and having an opening 122K that is opposed to the electric discharge space 42B, (b) a Z portion 120BZ extending in the Z direction and connected to a midway of the X portion 120BX and (c) an X portion 120BXX extending in the X direction and connected to the Z portion 120BZ. The X portion 120BXX is connected to the diffusing portion 82B.

An earth ground plate 124 is provided to a distal end of the X portion 120BX so as to close the individual passage 120B. Since each electron is likely to move linearly, it is possible to cause an electric discharge between the earth ground plate 124 and at least one of the electrodes, by providing the earth ground plate 124 in the X portion 120BX that extends linearly. Further, when the gas flowing in the individual passage 120B is charged, electrons are transferred between the charged gas and the earth ground plate 124 whereby the gas is at the same potential with the earth ground plate 124. Consequently, it is possible to cause the charged gas to be hardly supplied to the workpiece W.

In the present embodiment, a main passage of the individual passage 120B is constituted by a discharge-space side portion 120BXO of the X portion 120BX which is located on an electric-discharge-space side of a connection portion N of the X portion 120BX at which the X portion 120BX is connected to the Z portion 120BZ. Meanwhile, a branch passage of the individual passage 120B is constituted by a remote portion 120BXP of the X portion 120BX which is located on a side of the connection portion N which is remote from the electric discharge space 42B. The earth ground plate 124 is provided to close the branch passage 120BXP.

Embodiment 4

Figure 13:
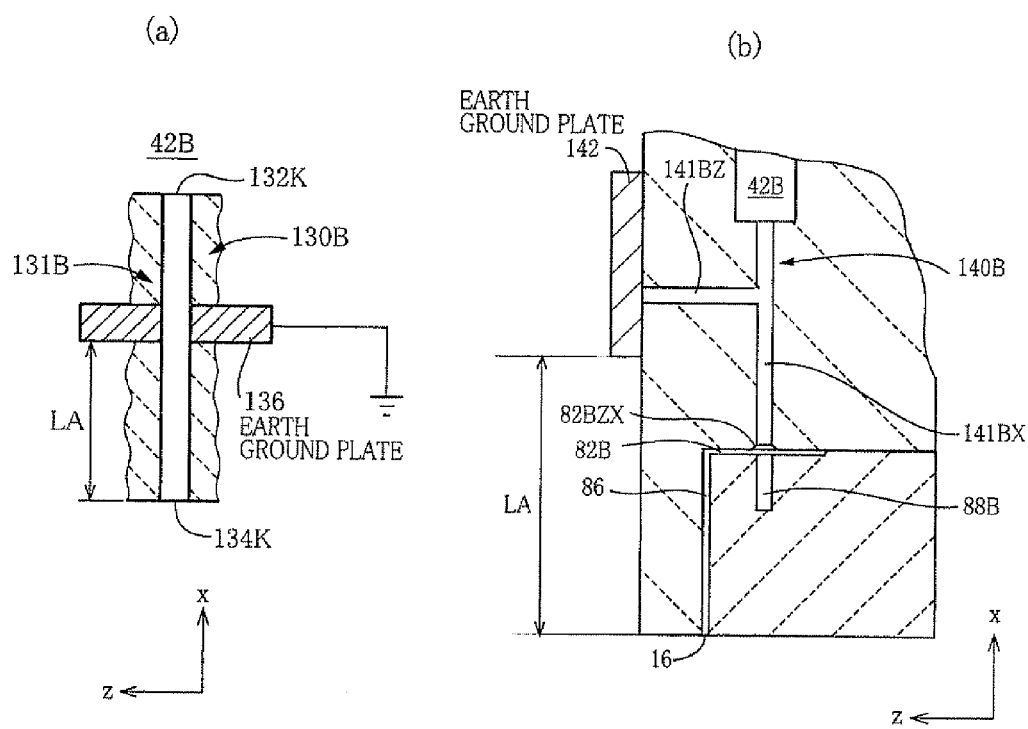
FIG. 13 is a set of views each schematically showing a periphery of still another radical outlet passage that is applicable to the above-described radical supply device (Embodiment 4).

In the present embodiment, as shown in FIG. 13 (a), the radical outlet passage is constituted by individual passage groups 130B-130D, and does not include any diffusing portion. Further, the radical output port does not have a slit-like shape.

Each of individual passages 131B belonging to the individual passage group 130B extends straight in the X direction. An end of each individual passage 131B serves as an opening 132K that is opposed to the electric discharge space 42B while another end of each individual passage 131B serves as an opening 134K that is opposed to an exterior of the main body 12. The radical output port is constituted by the plurality of openings 134K. The individual passages 131C, 131D belonging to the individual passage groups 130C, 130D have substantially the same construction as the individual passages 131B, and the drawings and descriptions thereof are omitted.

Further, an earth ground plate 136 is disposed in a midway of each individual passage 131B, such that the earth ground plate 136 is contactable with the gas containing plasma, which passes inside the individual passage 131B. Consequently, it is possible to make an electric discharge caused between the earth ground plate 136 and at least one of the electrodes, and to make an electric discharge hardly caused between the workpiece W and any one of the electrodes. Further, it is possible to make the charged gas hardly supplied to the workpiece W.

In this EMBODIMENT 4, each individual passage 130B extends linearly in the X direction. However, this arrangement may be modified such that the individual passage 131B is curved on a downstream side of the earth ground plate 136 and/or is provided with a diffusing portion on the downstream side of the earth ground plate 136.

This modification is shown, by way of example, in FIG. 13 (b). In this example of the modification, the radical outlet passage includes individual passage groups 140B-140D, diffusing portions 82B-82D and a slit passage 86. Each of individual passages 141BX belonging to the individual passage group 140B extends in the X direction. A branch passage 141BZ is connected to a midway of the individual passage 141BX and extends in the Z direction. An earth ground plate 142 is provided to close the branch passage 141BZ. The individual passages 141CX, 141DX belonging to the individual passage groups 140C, 140D have substantially the same construction as the individual passages 141BX, and the drawings and descriptions thereof are omitted.

Embodiment 5

Figure 14:
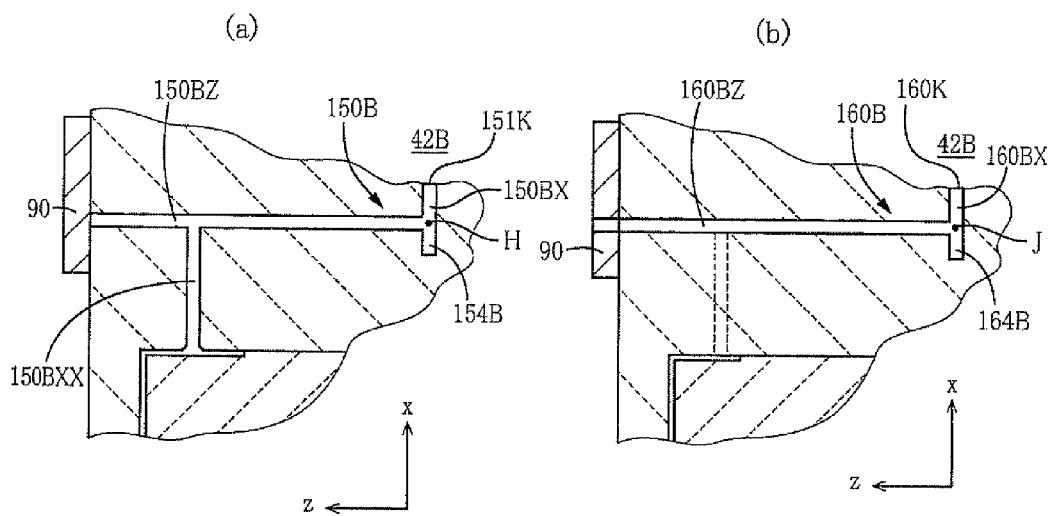
FIG. 14 is a set of views schematically showing a periphery of still another radical outlet passage that is applicable to the above-described radical supply device (Embodiment 5).

The present embodiment is different from the above-described embodiments with respect to a position of the pocket in the radical outlet passage. An example of this embodiment is shown in FIG. 14. This embodiment is substantially the same as the above-described embodiments with the respect to the other elements, so that descriptions of the other elements are omitted.

As shown in FIG. 14 (a), each of individual passages 150B, which constitute one of the individual passage groups of the radical outlet passage, includes (i) an X portion 150BX having an opening 151K that is opposed to the electric discharge space 42B, (ii) a Z portion 150BZ extending in the Z direction, and (iii) an X portion 150BXX connected to a midway of the Z portion 150BZ. A downwardly extending pocket 154B is provided in a connection portion H of the X portion 150BX at which the X portion 150BX is connected to the Z portion 150BZ. The pocket 154B is considered as an extension portion of the X portion 150BX.

Thus, the pocket 154B may be provided in any portion of each individual passage, as long as the portion in which the pocket 154B is provided is a midway of each individual passage. Further, two or more pockets may be provided in a midway of each individual passage.

It is noted that the individual passages 150C, 150D have substantially the same construction as the individual passages 150B, and the descriptions thereof are omitted.

Further, in the present embodiment, a pocket is provided also in a midway of each protective-gas exhaust passage.

As shown in FIG. 14 (b), each protective-gas exhaust passage 160B has an opening 160K that is opposed to the electric discharge space 42B, and includes an X portion 160BX extending in the X direction and a Z portion 160BZ extending in the Z direction. A downwardly extending pocket 164B is provided in a connection portion J of the X portion 160BX at which the X portion 160BX is connected to the Z portion 160BZ. The other protective-gas exhaust passages have substantially the same construction as the protective-gas exhaust passage 160B, and the descriptions thereof are omitted.

With provision of the pocket 164B in a midway of the protective-gas exhaust passage 160B, it is possible to reduce amount of dust that is to be exhausted together with the protective gas.

Embodiment 6

In the present embodiment, a protective-gas collection passage is provided in place of the protective-gas exhaust passage, so that dust is removed from a collected gas containing the protective gas, and the protective gas is recycled. Further, the dust is collected so as not to be emitted to an exterior.

Figure 15:
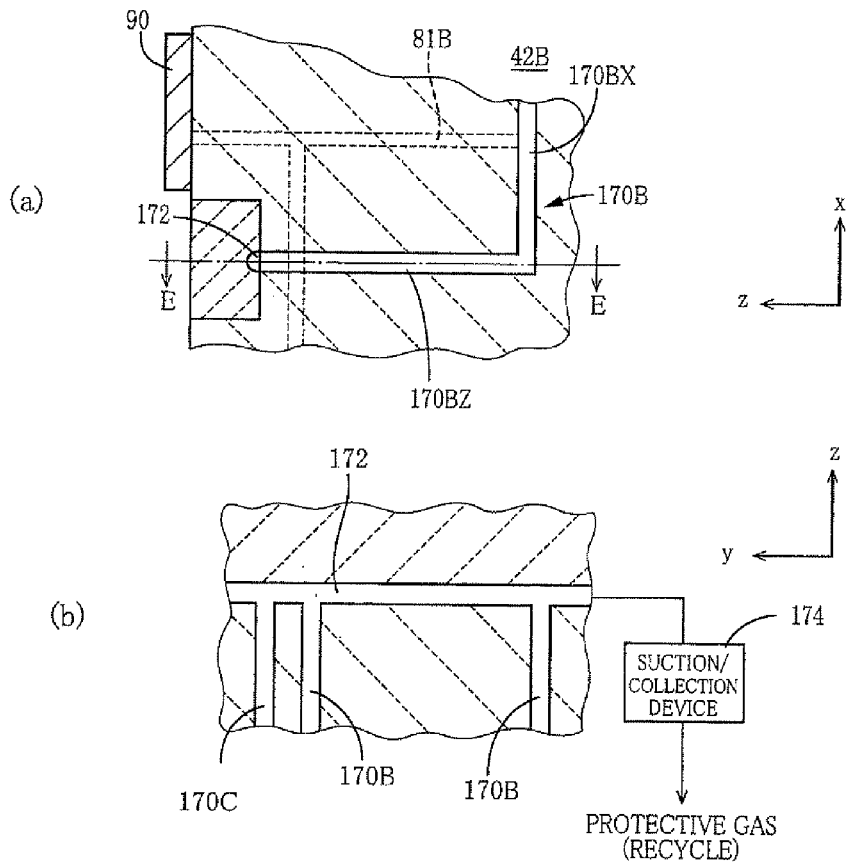
FIG. 15 is a set of views schematically showing a periphery of a protective-gas recycle passage that is applicable to the above-described radical supply device (Embodiment 6), wherein (b) is a cross sectional view taken along line E-E of (a).

FIG. 15 (a), (b) shows the present embodiment by way of example. Since the other portions of the surface treatment apparatus are the same as those of the above-described embodiments, the descriptions thereof are omitted.

Two protective-gas collection passages 170B are provided for the electric discharge space 42B, two protective-gas collection passages 170C are provided for the electric discharge space 42C, and two protective-gas collection passages 170D are provided for the electric discharge space 42D.

An end of each protective-gas collection passage 170B serves as an opening that is opposed to the electric discharge space 42B, while another end of each protective-gas collection passage 170B is connected to a common collection passage 172. To the common collection passage 172, the above-described two protective-gas collection passages 170B, two protective-gas collection passages 170C and two protective-gas collection passages 170D are connected. In the following descriptions, the protective-gas collection passage 170B will be described and descriptions of the protective-gas collection passages 170C, 170D are omitted. Further, one of the two passages 170C and the two passages 170D are not illustrated in the drawings.

To the common collection passage 172, there is connected a suction/collection device 174. The suction/collection device 174 includes a suction pump and a dust removal/collection mechanism (that may include, for example, filter, magnet and centrifugal separator), and is configured to collect a gas containing the protective gas and to remove and collect dust. The protective gas, from which the dust has been removed, is returned to the protective-gas supply passage.

Further, as shown in FIG. 15 (a), each of the protective-gas collection passages 170B includes (i) an X portion 170BX extending in the X direction and (ii) a Z portion 170BZ extending in the Z direction. As compared with each of the individual passages 81B of the radical outlet passage 78, the X portion 170BX is longer than the X portion 81BX of each individual passage 81B. Further, the Z portion 170BZ is located in a position that is distant from the Z portion 81BZ of each individual passage 81B in the X direction. Therefore, the common collection passage 172 can be formed without its interference with the radical outlet passage 78.

Thus, by recycling the protective gas, it is possible to reduce an amount of consumption of the argon gas and accordingly to reduce cost for the surface treatment.

It is noted that the common collection passage 172 may be provided outside the main body 18 of the radical supply device 2.

In most cases, a main body cover is provided outside the radical supply device 2 so that a majority of the device 2 is covered with the main body cover. In such cases, it is possible to employ a device configured to collect dust that accumulates inside (a lower portion of) the main body cover so as not to supply the dust to the workpiece W or configured to suck the protective gas (from above) so as to recycle the protective gas. Such a device may be provided outside the main body 18 of the radical supply device 2 and inside the main body cover that is not shown in the drawings.

Embodiment 7

In the above-described embodiments, the electrodes 22-25 are provided to extend in the X direction. In the present embodiment, electrode bars are provided to extend in the Z direction. Regarding the other portions of the surface treatment apparatus, the present embodiment is substantially the same as the above-described embodiments, so that the descriptions of the other portions are omitted.

Figure 16:
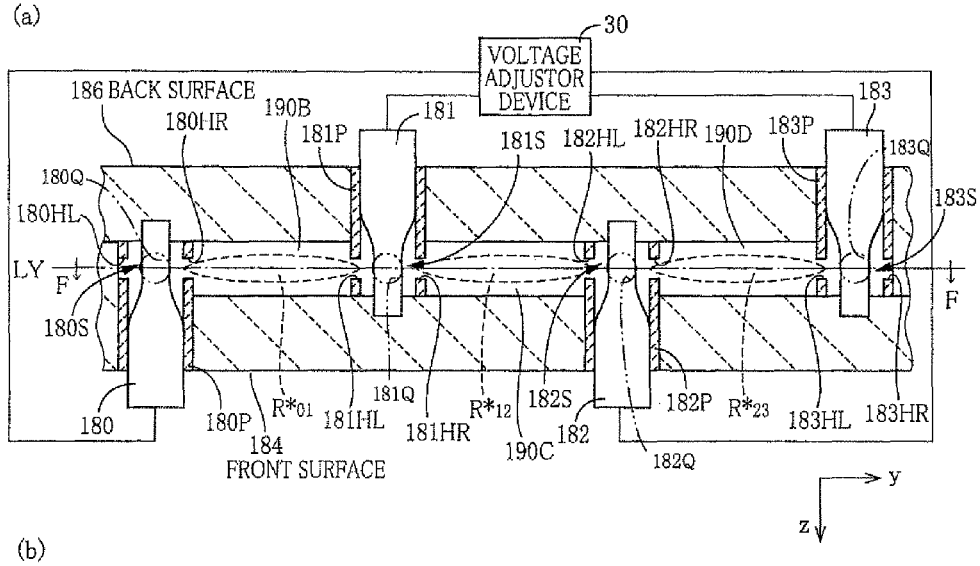
FIG. 16 is a set of views showing other electrodes that are applicable to the above-described radical supply device (Embodiment 7).
Figure 16:
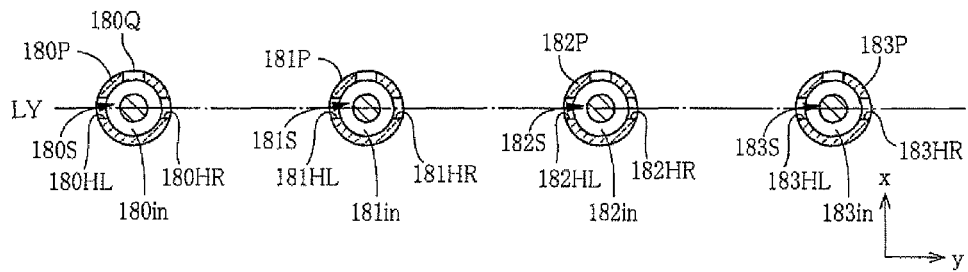
Figure 17:
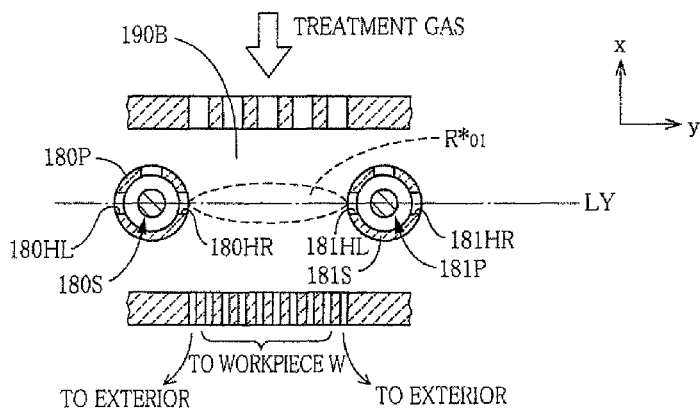
FIG. 17 is a cross sectional view taken along (a part of) line F-F of FIG. 16.

As shown in FIGS. 16 and 17, four electrode bars 180, 181, 182, 183 extending in the Z direction are alternately arranged at a constant spacing interval in the Y direction. The electrode bars 180, 182 protrude from a front surface 184 while the electrode bars 181, 183 protrude from a back surface 186. The electrode bars 180-183 arranged in the Y direction are held in parallel with one another.

Further, each of electrode covers 180P-183P is provided in an outer peripheral side of a corresponding one of electrode bars 180-183. Each of the electrode covers 180P-183P is provided with a corresponding one of pairs of electric-discharge openings 180HL, 180HR-183HL, 183HR, so that an electric discharge can be caused between each adjacent two of electric-discharge electrode portions 180S-183S whereby electric discharge regions R*01, R*12, R*23 are formed.

Further, the protective gas is supplied through protective-gas inlet ports 180Q-183Q to clearances 180in-183in (i.e., peripheries of the respective electric-discharge electrode portions) each of which is defined between a corresponding one of the electrode covers 180P-183P and a corresponding one of the electrode bars 180-183. The protective gas is then caused to outflow through the electric-discharge openings 180HR, 181HL, 181HR, 182HL, 182HR, 183HL. Thus, the atmosphere on the surface of each of the electric-discharge electrode portions 180S-183S is separated from the treatment gas.

As in the above-described embodiments, the treatment gas is supplied to each of electric discharge spaces 190B-190D, and the formed radicals or the like are supplied to the workpiece W via the radical outlet passage 78.

While there have been described a plurality of embodiments of the invention, the invention may be carried out by combining features of the respective embodiments with each other.

Further, the provision of the electrode covers 22P-25P is not essential. That is, the protective gas may be supplied directly to the electrodes 22-25.

Further, the number of the electrodes is not necessarily four, and may be, for example, two, three or five or more. By increasing the number of the electrodes, it is possible to increase a length of the radical output port 16 in the Y direction. Consequently, it is possible to reduce a length of time required for the treatment, as long as the treatment surface WF is not changed.

Further, in the above-described embodiments, the protective gas is supplied to each of the electrode covers or electric-discharge electrode portions, independently of the other of the electrode covers or electric-discharge electrode portions. However, the protective gas may be supplied commonly to the plurality of electrode covers. For example, it is possible to employ an arrangement in which the protective gas is supplied to one of the electrode covers and is then circulated in the other electrode covers before being caused to outflow.

Further, each of the electrode covers may be provided with a protective-gas outlet port in addition to the electric-discharge opening. In this case, it is possible to cause the protective gas to outflow to a space that is other than the electric discharge space.

Further, the earth ground plate does not necessarily have to be provided in a position specified in each of the above-described embodiments, but may be provided in any position.

Further, the radical outlet passage 78 may have a curved portion or two or more curved portions.

Further, the present invention is applicable also a surface treatment apparatus for performing a surface treatment or the like by irradiating positive or negative ions formed in a plasma, to a workpiece.

Moreover, the present invention can be carried out in not only the modes described in the plurality of embodiments but also in other modes of various modifications and improvements that will be made based on knowledge of a person skilled in the art.

DESCRIPTION OF REFERENCE SIGNS

2: radical supply device 4: supply-device holding portion 6: workpiece holding portion 7: relative movement device 16: radical output port 18: main body 22-25: electrodes 22P-25P: electrode covers 22HL, 22HR 25HL, 25HR: electric-discharge openings 22in-25in: clearances 22S-25S: electric-discharge electrode portions 22Q-25Q: protective-gas inlet ports 34: protective-gas supply passage 42: electric discharge space 48: treatment-gas supply passage 78: radical outlet passage 80: individual passage 82: diffusing portion 86: slit passage 88: pocket 90: earth ground plate 92: protective-gas exhaust passage 94: exhaust port 124: earth ground plate 120: individual passage 130: individual passage 136: earth ground plate 150: individual passage 160: protective-gas exhaust passage 154, 164: pockets 180-184: electrodes

The invention claimed is:
1. A reactive-species supply device configured to supply a treatment gas to an electric discharge space, for thereby supplying at least a reactive species formed in a plasma, to an object, said reactive-species supply device comprising:
a main body;
at least one pair of electrodes having an elongated shape; and
an electrode protection device configured to protect said electrodes from the treatment gas, wherein
each of said at least one pair of electrodes consists of two electrodes that are held by said main body, such that said two electrodes are spaced apart from each other in a width direction of said main body, and such that said two electrodes are parallel to each other,
said electrode protection device includes electrode covers that are held by said main body, such that each of said electrodes is covered at an outer circumferential surface thereof by a corresponding one of said electrode covers, each of said electrode covers having a cylindrical shape,
each adjacent two of said electrode covers have: (i) a top portion having an opening through which a respective electrode extends in a lengthwise direction, along an x-axis, away from the main body; and (ii) respective electric-discharge openings provided in respective side portions of each adjacent two of said electrode covers, the respective electric-discharge openings being opposed to each other in said width direction, along a y-axis, and said electric discharge space is defined between the respective side portions of each of said at least one pair of electrodes.

2. The reactive-species supply device according to claim 1, wherein said electrode protection device includes a protective-gas supplying portion configured to supply a protective gas to said electrodes.

3. The reactive-species supply device according to claim 2, wherein said protective-gas supplying portion includes a cover-inside protective-gas supplying portion configured to supply the protective gas to insides of said electrode covers.

4. The reactive-species supply device according to claim 3, wherein said cover-inside protective-gas supplying portion includes protective-gas inlet ports provided in said electrode covers, each of said respective side portions being located on a downstream side of a corresponding one of said protective-gas inlet ports.

5. The reactive-species supply device according to claim 4, further comprising:

a reactive-species output port through which at least the reactive species is to be outputted, wherein said cover-inside protective-gas supplying portion includes a protective-gas exhaust passage, and wherein an end of said protective-gas exhaust passage serves as an opening disposed to be adjacent to a portion of one of said electrode covers in which one of said electric-discharge openings is provided, while another end of said protective-gas exhaust passage serves as an exhaust port disposed in a position that is distant from said reactive-species output port.

6. The reactive-species supply device according to claim 4, further comprising:

a plurality of individual outlet passages which are disposed on a downstream side of said electric discharge space and which have a plurality of discharge-space-side openings arranged between each adjacent two of said electrodes, wherein each of opposite-end ones of said individual outlet passages is in communication with an exhaust port disposed in a position that is distant from a reactive-species output port through which the reactive species is to be outputted, while each of intermediate ones of said individual outlet passages located between said opposite-end ones is in communication with said reactive-species output port.

7. The reactive-species supply device according to claim 4, further comprising:

a protective-gas handling portion configured to handle a protective gas supplied to said electrodes, wherein said protective-gas handling portion includes a dust separating portion configured to separate dust from the protective gas that has been caused to flow out from said electric-discharge openings.

8. The reactive-species supply device according to claim 7, wherein said dust separating portion includes a pocket that is disposed in a midway of a protective-gas exhaust passage, and wherein an end of said protective-gas exhaust passage serves as an opening disposed to be adjacent to a portion of one of said electrode covers in which one of said electric-discharge openings is provided, while another end of said protective-gas exhaust passage serves as an exhaust port disposed in a position that is distant from a reactive-species output port through which the reactive species is to be outputted.

9. The reactive-species supply device according to claim 2, wherein the treatment gas contains a carrier gas and a reaction gas, and the protective gas is the same in kind as the carrier gas contained in the treatment gas.

10. A surface treatment apparatus configured to perform a treatment on a surface of an object, said surface treatment apparatus comprising:

a reactive-species-supply-device holding portion that holds said reactive-species supply device recited in claim 1;

an object holding portion configured to hold the object; and a relative movement device configured to relatively move said reactive-species-supply-device holding portion and said object holding portion.

* * * * *